(12) United States Patent
Park

(10) Patent No.: US 9,991,442 B2
(45) Date of Patent: Jun. 5, 2018

(54) METHOD FOR MANUFACTURING MAGNETIC MEMORY DEVICE

(71) Applicant: Jongchul Park, Seongnam-si (KR)

(72) Inventor: Jongchul Park, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days. days.

(21) Appl. No.: 15/415,828

(22) Filed: Jan. 25, 2017

(65) Prior Publication Data

US 2017/0263675 A1    Sep. 14, 2017

(30) Foreign Application Priority Data

Mar. 10, 2016    (KR) .......................... 10-2016-0028982

(51) Int. Cl.
| | |
|---|---|
| *H01L 43/12* | (2006.01) |
| *H01L 43/02* | (2006.01) |
| *H01L 27/22* | (2006.01) |
| *H01L 43/08* | (2006.01) |
| *G11C 11/16* | (2006.01) |
| *H01L 43/10* | (2006.01) |

(52) U.S. Cl.
CPC ............ *H01L 43/12* (2013.01); *H01L 27/226* (2013.01); *H01L 27/228* (2013.01); *H01L 43/02* (2013.01); *H01L 43/08* (2013.01); *G11C 11/161* (2013.01); *H01L 43/10* (2013.01)

(58) Field of Classification Search
CPC ........... H01L 21/02071; H01L 21/2633; H01L 21/3065–21/3081; H01L 41/332; H01L 41/47; H01L 43/00–43/14; H01L 27/22–27/228
See application file for complete search history.

(56) References Cited

U.S. PATENT DOCUMENTS

| | | |
|---|---|---|
| 6,984,530 B2 | 1/2006 | Lee et al. |
| 7,046,545 B2 | 5/2006 | Hosotani |
| 8,530,939 B2 | 9/2013 | Sills et al. |
| 8,828,743 B1 | 9/2014 | DeBrosse et al. |

(Continued)

FOREIGN PATENT DOCUMENTS

| | | |
|---|---|---|
| JP | 2015146355 A | 8/2015 |
| JP | 2015179694 A | 10/2015 |
| KR | 20120086938 A | 8/2012 |

*Primary Examiner* — Marvin Payen
*Assistant Examiner* — Jeremy Joy
(74) *Attorney, Agent, or Firm* — Renaissance IP Law Group LLP

(57) ABSTRACT

A method for manufacturing a magnetic memory device includes forming a magnetic tunnel junction layer that includes a first magnetic layer, a tunnel barrier layer, and a second magnetic layer sequentially stacked on a substrate. First line mask patterns are formed extending in a first direction and spaced apart from each other in a second direction crossing the first direction. The magnetic tunnel junction layer is etched by a first ion-beam etch process using the first line mask patterns as an etch mask to form preliminary magnetic tunnel junctions. Second line mask patterns are formed extending in the second direction and spaced apart from each other in the first direction. The preliminary magnetic tunnel junctions are etched by a second ion-beam process using the second line mask patterns as an etch mask to form magnetic tunnel junctions.

19 Claims, 27 Drawing Sheets

(56) References Cited

U.S. PATENT DOCUMENTS

| | | |
|---|---|---|
| 9,070,869 B2 | 6/2015 | Jung et al. |
| 9,166,154 B2 | 10/2015 | Satoh et al. |
| 9,190,607 B2 | 11/2015 | Nomachi |
| 2004/0095813 A1 | 5/2004 | Hosotani |
| 2005/0020076 A1 | 1/2005 | Lee et al. |
| 2005/0214953 A1 | 9/2005 | Lee et al. |
| 2009/0104718 A1* | 4/2009 | Zhong .................... B82Y 10/00 438/3 |
| 2011/0198314 A1* | 8/2011 | Wang .................... B82Y 25/00 216/22 |
| 2012/0235211 A1 | 9/2012 | Sills et al. |
| 2013/0241015 A1* | 9/2013 | Nomachi ................ H01L 43/08 257/421 |
| 2013/0316536 A1 | 11/2013 | Seto et al. |
| 2014/0070342 A1* | 3/2014 | Sandhu .................. H01L 43/08 257/421 |
| 2014/0087483 A1* | 3/2014 | Ohsawa .................. H01J 37/08 438/3 |
| 2014/0116984 A1* | 5/2014 | Ding .................... G11B 5/3116 216/22 |
| 2014/0159176 A1 | 6/2014 | Nomachi |
| 2014/0170776 A1 | 6/2014 | Satoh et al. |
| 2014/0273286 A1 | 9/2014 | DeBrosse et al. |
| 2015/0104882 A1 | 4/2015 | Jung et al. |
| 2015/0263273 A1 | 9/2015 | Yoshikawa et al. |
| 2015/0287911 A1* | 10/2015 | Kim ........................ H01L 43/12 438/3 |
| 2016/0196951 A1 | 7/2016 | Ohsawa et al. |
| 2016/0197268 A1* | 7/2016 | Yakabe .................. H01L 43/08 257/421 |

\* cited by examiner

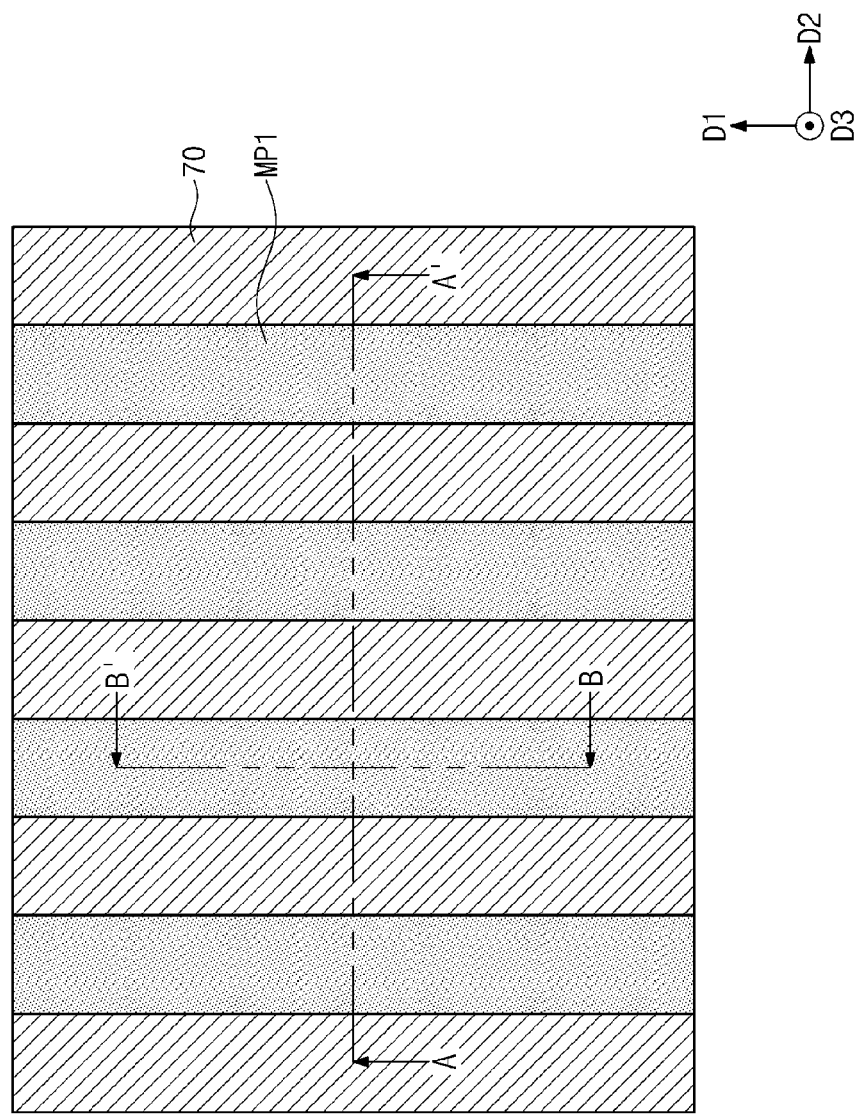

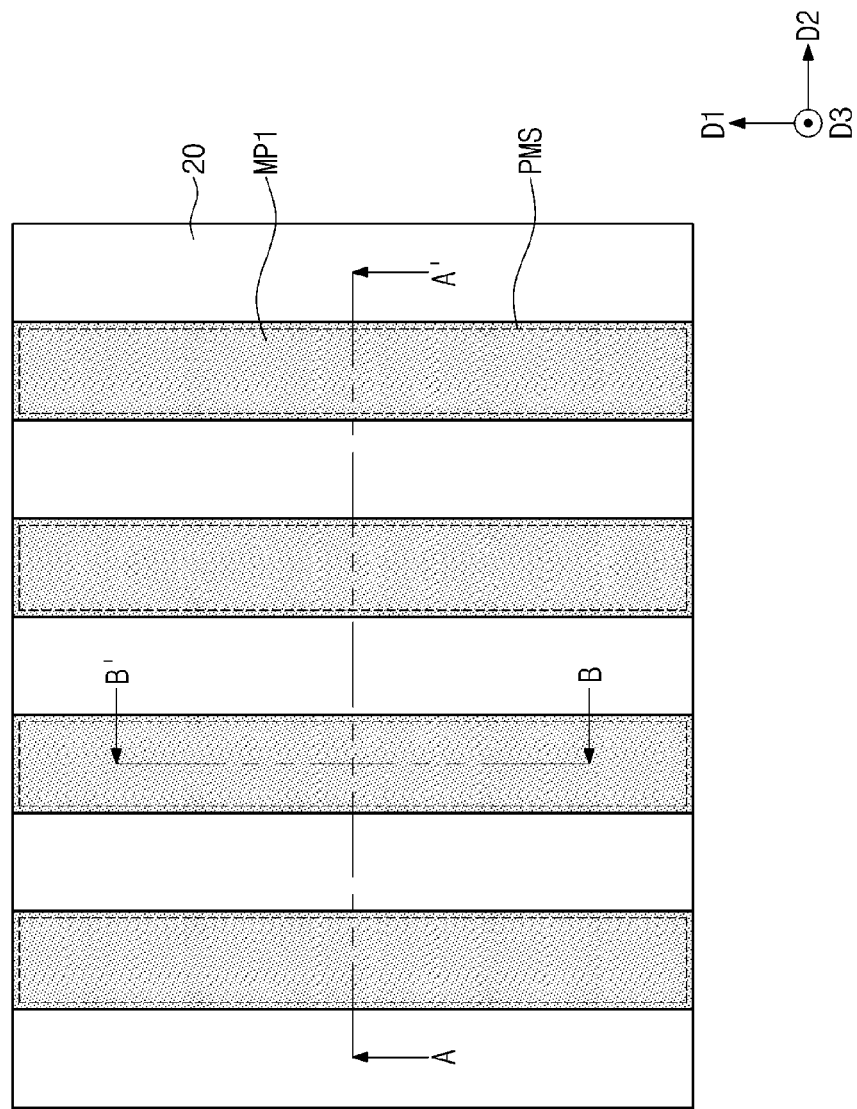

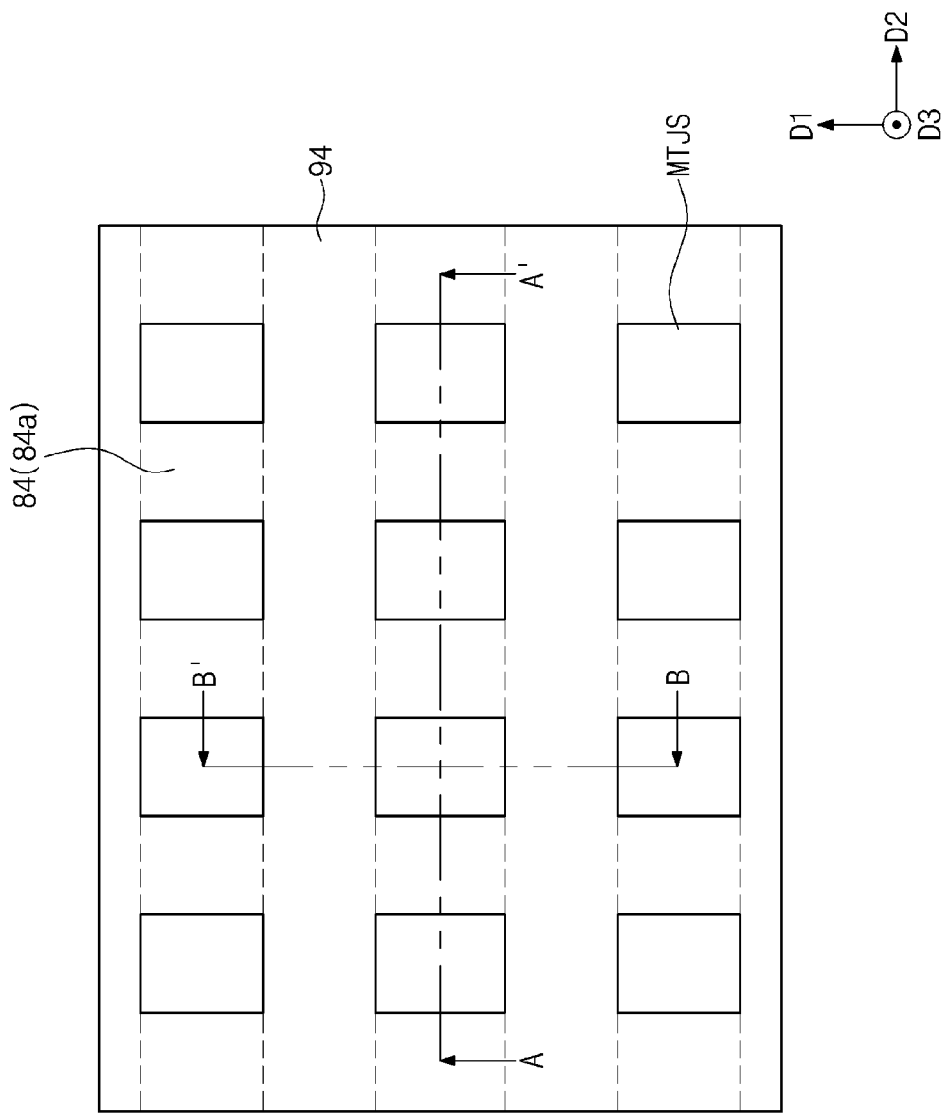

METHOD FOR MANUFACTURING MAGNETIC MEMORY DEVICE

CROSS-REFERENCE TO RELATED APPLICATIONS

This U.S. nonprovisional patent application claims priority under 35 U.S.C. § 119 of Korean Patent Application 10-2016-0028982 filed on Mar. 10, 2016, the entire contents of which are hereby incorporated by reference.

BACKGROUND

The present inventive concept relates to a method for manufacturing a magnetic memory device and, more particularly, to a method for manufacturing a magnetic memory device that includes a magnetic tunnel junction.

As electronic devices trend toward high speed and low-power consumption, high-speed read/write operations and low operation voltages are required for semiconductor memory devices incorporated in the electronic devices. In order to meet such a requirement, magnetic memory devices have been proposed as semiconductor memory devices that provide high-speed read/write operations and that use low operation voltages. Since magnetic memory devices operate at high speed and have nonvolatile characteristics, the magnetic memory devices have attracted considerable attention as next generation memory devices.

A magnetic memory device may include a magnetic tunnel junction (MTJ). The magnetic tunnel junction may include two magnetic structures and a tunnel barrier layer interposed between the two magnetic structures. The resistance of the magnetic tunnel junction may vary depending on magnetization directions of the two magnetic structures. For example, if the magnetization directions of the two magnetic structures are anti-parallel to each other, the magnetic tunnel junction may have a relatively high resistance. If the magnetization directions of the two magnetic structures are parallel to each other, the magnetic tunnel junction may have a relatively low resistance. The magnetic memory device may write/read data using the difference in resistance between the high resistance and the low resistance of the magnetic tunnel junction.

With the remarkable advances in electronic industry, there is an increasing demand for high density and/or low power consumption of a magnetic memory device. Accordingly, many studies have been conducted to meet these demands.

SUMMARY

Embodiments of the present inventive concept provide a method for forming a magnetic tunnel junction that is capable of easily removing an etch byproduct that may be formed on the magnetic tunnel junction.

Embodiments of the present inventive concept provide a method for manufacturing a magnetic memory device having a superior reliability.

According to exemplary embodiments of the present inventive concept, a method for manufacturing a magnetic memory device may include: forming a magnetic tunnel junction layer including a first magnetic layer, a tunnel barrier layer, and a second magnetic layer that are sequentially stacked on a substrate; forming, on the magnetic tunnel junction layer, first line mask patterns that extend in a first direction and are spaced apart from each other in a second direction that crosses the first direction; etching the magnetic tunnel junction layer by a first ion-beam etch process using the first line mask patterns as an etch mask to form preliminary magnetic tunnel junctions that extend in the first direction; forming, on the preliminary magnetic tunnel junctions, second line mask patterns that extend in the second direction and are spaced apart from each other in the first direction; and etching the preliminary magnetic tunnel junctions by a second ion-beam process using the second line mask patterns as an etch mask to form magnetic tunnel junctions. The magnetic tunnel junctions may be arranged to be in shapes of islands along the first direction and the second direction.

According to exemplary embodiments of the present inventive concept, a method for manufacturing a magnetic memory device may include: forming a magnetic tunnel junction layer including a first magnetic layer, a tunnel barrier layer, and a second magnetic layer that are sequentially stacked on a substrate; and patterning the magnetic tunnel junction layer to form magnetic tunnel junctions that are arranged in a shape of an island along a first direction and a second direction crossing the first direction. The patterning the magnetic tunnel junction layer may include: performing a first ion-beam etch process that uses first line mask patterns as an etch mask, wherein the first line mask patterns extend in the first direction and are arranged along the second direction; and performing a second ion-beam etch process that uses second line mask patterns as an etch mask, wherein the second line mask patterns extend in the second direction and are arranged along the first direction. The first ion-beam etch process may use first and second ion beams that are obliquely incident toward the substrate. The first and second ion beams may be substantially reciprocally symmetric to a normal line that is perpendicular to a top surface of the substrate. The second ion-beam etch process may use third and fourth ion beams that are obliquely incident toward the substrate. The third and fourth ion beams may be substantially reciprocally symmetric to the normal line. The first to fourth ion beams may have different incident directions from each other.

An embodiment may provide a method to form a magnetic memory device that may include: forming a magnetic tunnel junction layer in which the magnetic tunnel junction layer may include a first magnetic layer, a second magnetic layer and a tunnel barrier layer between the first magnetic layer and the second magnetic layer; forming first line mask patterns on the magnetic tunnel junction layer in which the first line mask patterns extend in a first direction and are spaced apart from each other in a second direction that is substantially perpendicular to the first direction and in which the first and second directions are substantially parallel to a top surface of the magnetic tunnel junction layer; etching the magnetic tunnel junction layer using a first ion-beam etch to form a plurality of preliminary magnetic tunnel junctions that extend in the first direction in which the first ion-beam etch includes a vector component that is projected onto a plane formed by the first and second directions and in which the projected vector component of the first ion-beam etch is in a direction that is substantially parallel to the second direction; forming second line mask patterns on the preliminary magnetic tunnel junctions in which the second line mask patterns extend in the second direction and are spaced apart from each other in the first direction; and etching the preliminary magnetic tunnel junctions using a second ion-beam etch to form magnetic tunnel junction patterns each having an island shape in which the second ion-beam etch includes a vector component that is projected onto the plane formed by the first and second directions, the projected vector component of the second ion-beam etch being in a direction that is substantially parallel to the first direction.

An embodiment may provide a method to form a magnetic memory device that may include: forming a magnetic tunnel junction layer in which the magnetic tunnel junction layer comprises a first magnetic layer, a second magnetic layer and a tunnel barrier layer between the first and second magnetic layers; and patterning the magnetic tunnel junction layer to form magnetic tunnel junctions in shapes of islands along a first direction and a second direction in which the second direction crosses the first direction and in which the first and second directions are substantially parallel to a top surface of the magnetic tunnel junction layer, the patterning of the magnetic tunnel junction layer may include: performing a first ion-beam etch that uses first line mask patterns as an etch mask in which the first line mask patterns extend in the first direction and are separated from each other in the second direction; and performing a second ion-beam etch that uses second line mask patterns as an etch mask in which the second line mask patterns extend in the second direction and are separated from each other in the first direction, the first ion-beam etch may include first and second ion beams that are simultaneously obliquely incident toward a plane formed by the first and second directions in which the first and second ion beams are substantially reciprocally symmetric to a normal line that is substantially perpendicular to the plane formed by the first and second directions, the second ion-beam etch may include third and fourth ion beams that are simultaneously obliquely incident toward the plane formed by the first and second directions in which the third and fourth ion beams are substantially reciprocally symmetric to the normal line, and the first to fourth ion beams may have different incident directions from each other.

BRIEF DESCRIPTION OF THE DRAWINGS

FIGS. 4A, 5A, 6A, 8A, 9A, 10A, 11A and 13A depict plan views illustrating a method for manufacturing a memory device according to exemplary embodiments of the present inventive concept;

DETAILED DESCRIPTION OF EMBODIMENTS

Figure 1:
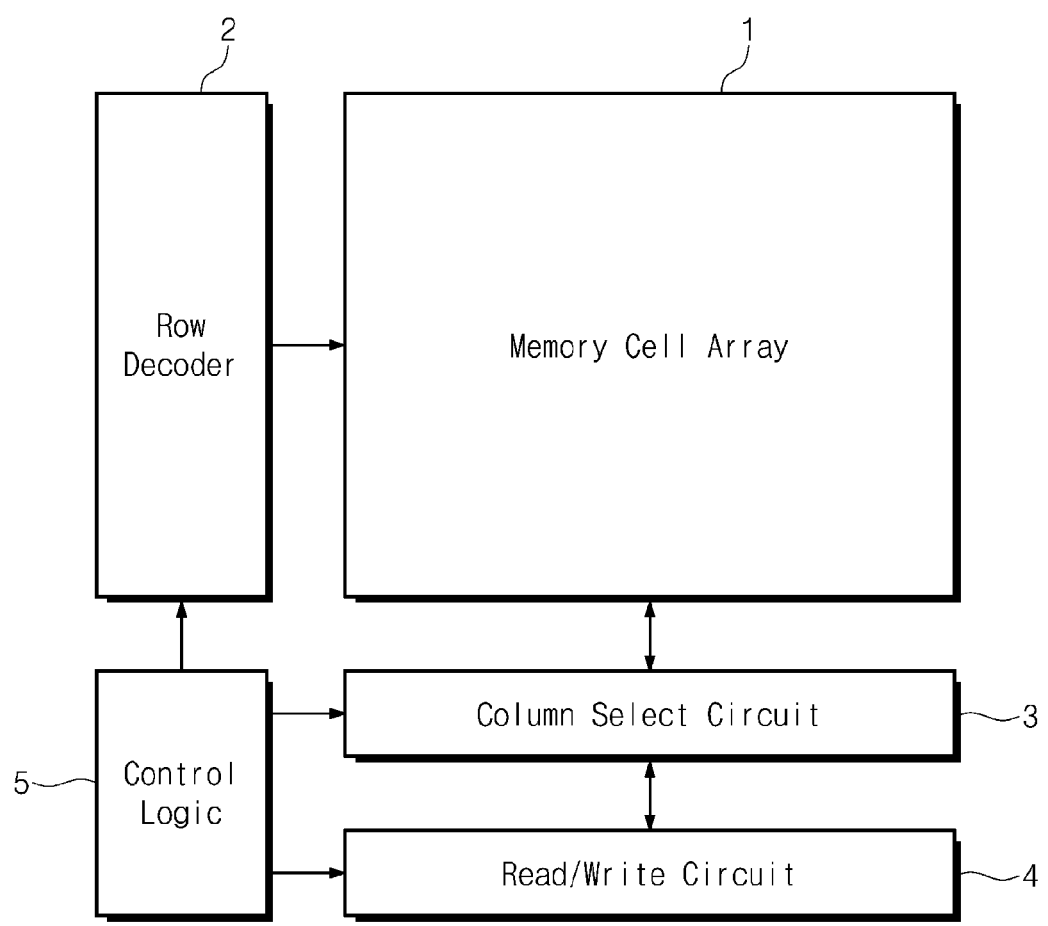
FIG. 1 depicts a block diagram illustrating a magnetic memory device according to exemplary embodiments of the present inventive concept.

FIG. 1 depicts a block diagram illustrating a magnetic memory device according to exemplary embodiments of the present inventive concept.

Referring to FIG. 1, a magnetic memory device may include a memory cell array 1, a row decoder 2, a column select circuit 3, a read/write circuit 4, and a control logic 5.

The memory cell array 1 may include a plurality of word lines and a plurality of bit lines, and memory cells may be connected to intersections where the word lines and the bit lines cross each other. A configuration of the memory cell array 1 will be further discussed in detail with reference to FIG. 2.

The row decoder 2 may be connected to the memory cell array 1 through the word lines. The row decoder 2 may decode an externally input address to select one of a plurality of word lines.

The column select circuit 3 may be connected to the memory cell array 1 through the bit lines, and may decode an externally input address to select one of a plurality of bit lines. The bit line selected by the column select circuit 3 may be connected to the read/write circuit 4.

The read/write circuit 4 may provide a bit-line bias for accessing a selected memory cell under control of the control logic 5. The read/write circuit 4 may provide a bit-line voltage to a selected bit line to read data from or write data to a memory cell.

The control logic 5 may output control signals that control the magnetic memory device in response to an externally provided command signal. The read/write circuit 4 may be controlled by the control signals that are output from the control logic 5.

Figure 2:
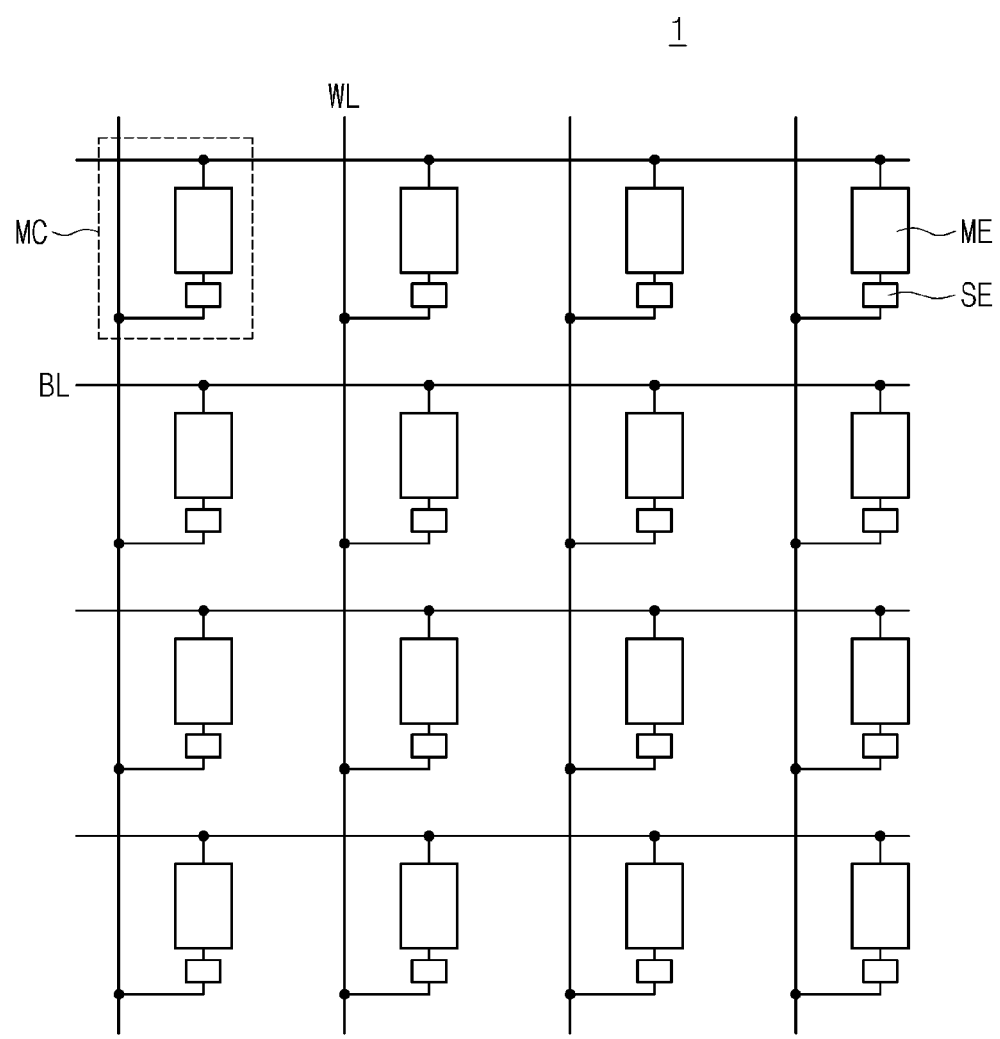
FIG. 2 depicts a circuit diagram illustrating a memory cell array of a magnetic memory device according to exemplary embodiments of the present inventive concept.

FIG. 2 depicts a circuit diagram illustrating a memory cell array 1 of a magnetic memory device according to exemplary embodiments of the present inventive concept.

Referring to FIG. 2, the memory cell array 1 may include a plurality of first conductive lines, a plurality of second conductive lines, and a plurality of unit memory cells MC. The first conductive lines may be word lines WL, and the second conductive lines may be bit lines BL. The unit memory cells MC may be two-dimensionally or three-dimensionally arranged. The unit memory cells MC may be connected between the word lines WL and the bit lines BL crossing each other. That is, a unit memory cell MC may be connected at a location where a word line WL and a bit line cross each other. Each of the word lines WL may connect some of the plurality of the unit memory cells MC with one another. Each of the bit lines BL may be connected to some of the unit memory cells MC in that each memory cell MC that is connected to a bit line BL is connected to one of the word lines WL. Accordingly, each of the bit lines BL may connect the read/write circuit 4 of FIG. 1 to each of the unit memory cells MC in which each memory cell MC is connected to one of the word lines WL.

Each of the unit memory cells MC may include a memory device ME and a select device SE. The memory device ME may be connected between a bit line BL and the select device SE, and the select device SE may be connected between the memory device ME and a word line WL. The memory device ME may be a variable-resistance device that is switched between two resistive states by an applied electrical pulse.

In an embodiment, the memory device ME may have a thin-film structure having an electrical resistance that is changed by a spin transfer caused by current passing through the thin-film structure. The memory device ME may have a thin-film structure configured to provide magnetoresistance characteristics, and may include a ferromagnetic material and/or an antiferromagnetic material. More specifically, the memory device ME may be a magnetic memory device that includes a magnetic tunnel junction (MTJ).

The select device SE may be configured to selectively control a flow of charges passing through the memory device ME. For example, the select device SE may be a diode, a PNP bipolar transistor, an NPN bipolar transistor, an NMOSFET transistor, or a PMOSFET transistor. If the select device SE includes a three terminal device, such as a bipolar transistor or a MOSFET transistor, an additional interconnection line (not shown) may be connected to the select device SE.

Hereinafter, a method will be disclosed for manufacturing a memory device ME according to exemplary embodiments of the present inventive concept.

Figure 3:
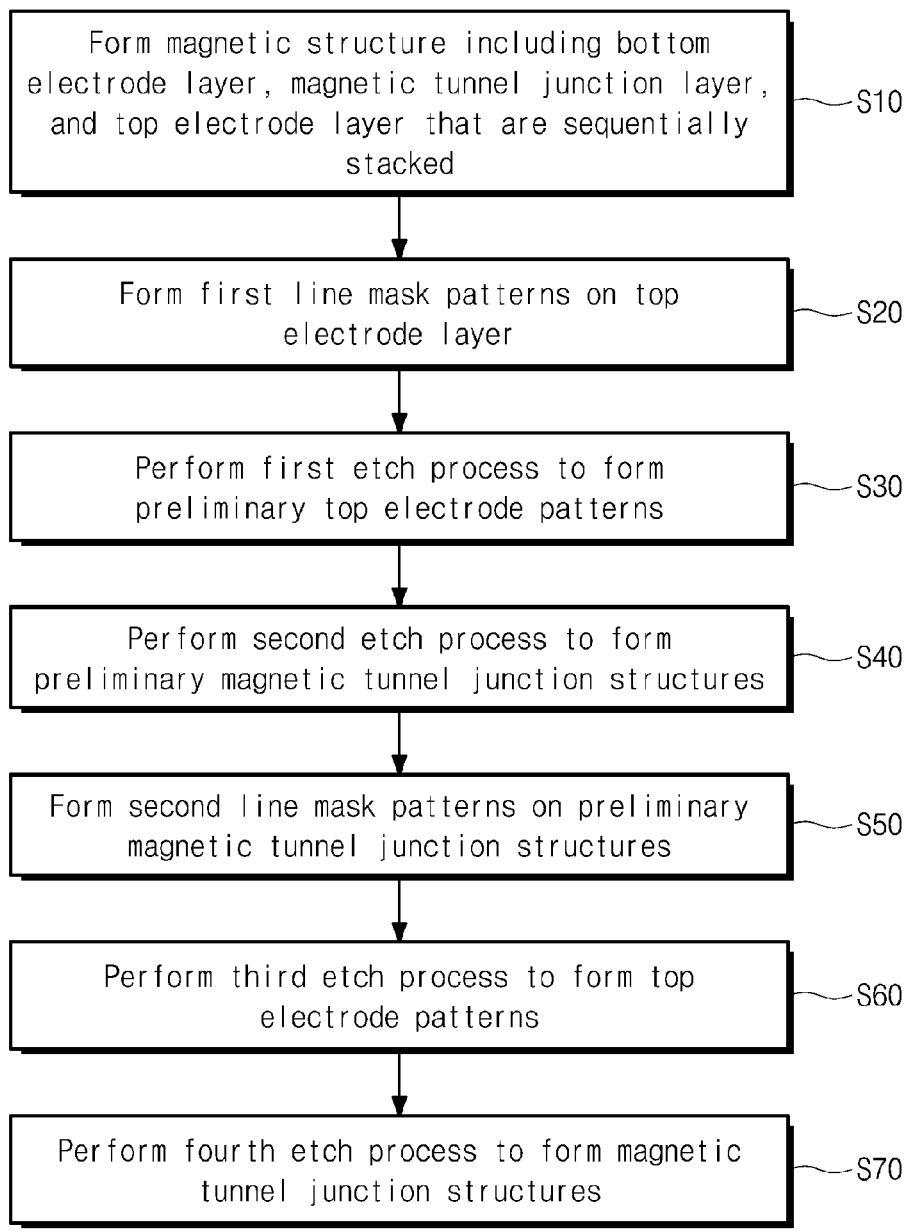
FIG. 3 depicts a flow chart showing a method for manufacturing a memory device according to exemplary embodiments of the present inventive concept.

FIG. 3 depicts a flow chart showing a method for manufacturing a memory device according to exemplary embodiments of the present inventive concept. FIGS. 4A, 5A, 6A, 8A, 9A, 10A, 11A and 13A depict plan views illustrating a method for manufacturing a memory device according to exemplary embodiments of the present inventive concept. FIGS. 4B, 5B, 6B, 8B, 9B, 10B, 11B and 13B respectively depict cross-sectional views corresponding to lines A-A' and B-B' of FIGS. 4A, 5A, 6A, 8A, 9A, 10A, 11A and 13A. FIG. 7A depicts a plan view for explaining incident directions of first and second ion beams, and FIG. 7B depicts an enlarged view illustrating a portion A of FIG. 6B. FIG. 12 depicts a plan view for explaining incident directions of third and fourth ion beams.

Figure 4B:
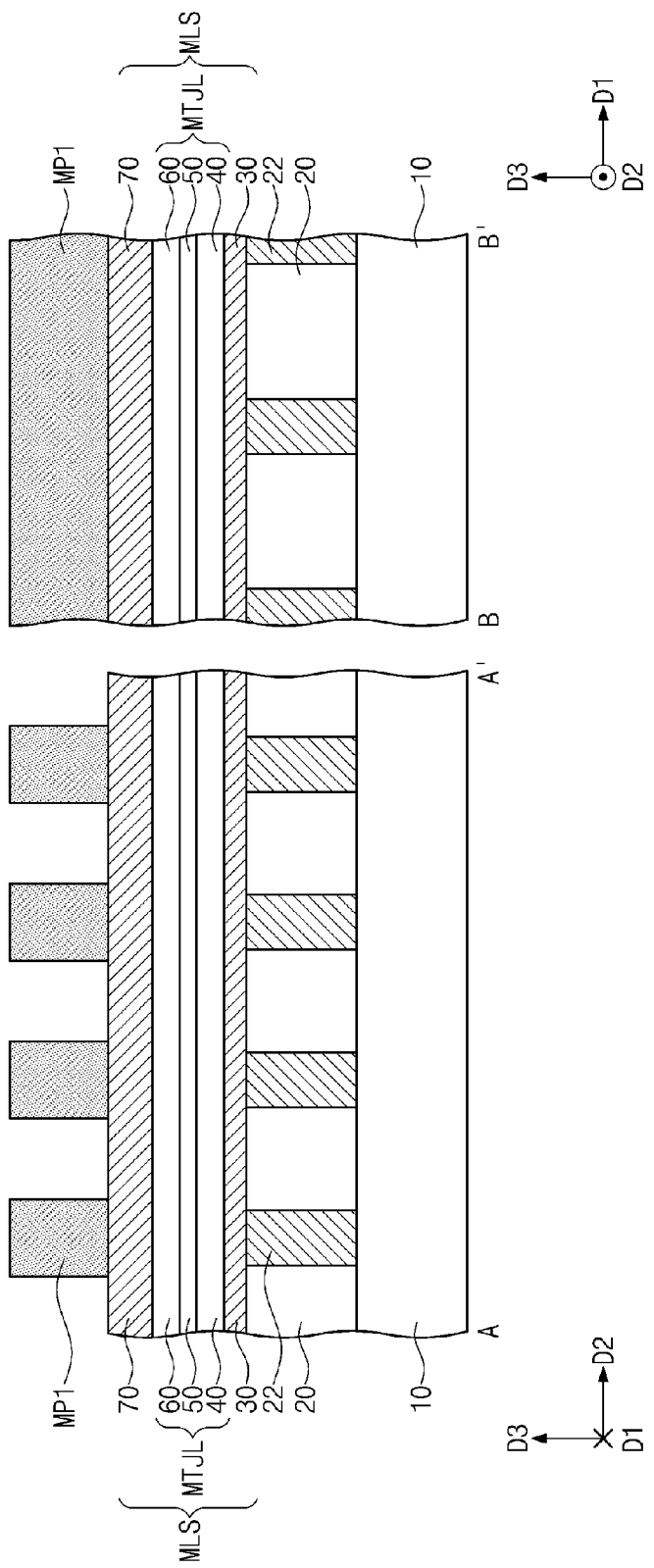
FIGS. 4B, 5B, 6B, 8B, 9B, 10B, 11B and 13B respectively depict cross-sectional views corresponding to lines A-A' and B-B' of FIGS. 4A, 5A, 6A, 8A, 9A, 10A, 11A and 13A.

Referring to FIGS. 3, 4A and 4B, a lower interlayer dielectric layer 20 may be formed on a substrate 10. The substrate 10 may be a silicon substrate, a germanium substrate, and/or a silicon-germanium substrate. The substrate 10 may have a conductive region (not shown). The lower interlayer dielectric layer 20 may be formed from oxide (e.g., silicon oxide), nitride (e.g., silicon nitride), and/or oxynitride (e.g., silicon oxynitride).

A contact plug 22 may be formed in the lower interlayer dielectric layer 20. The contact plug 22 may be connected to the conductive region (not shown) in the substrate 10. The contact plug 22 may include a semiconductor material doped with dopant (e.g., doped silicon, etc.), a metal (e.g., tungsten, aluminum, titanium, and/or tantalum), a conductive metal nitride (e.g., titanium nitride, tantalum nitride, and/or tungsten nitride), and/or a metal semiconductor compound (e.g., metal silicide).

A magnetic structure MLS may be formed on the lower interlayer dielectric layer 20 (S10). The magnetic structure MLS may include a bottom electrode layer 30, a magnetic tunnel junction layer MTJL, and a top electrode layer 70 that are sequentially stacked on the lower interlayer dielectric layer 20. The bottom electrode layer 30 may include a conductive metal nitride, such as titanium nitride and/or tantalum nitride. The bottom electrode layer 30 may include a material (e.g., Ru, etc.) that may assist crystal growth of magnetic layers forming the magnetic tunnel junction layer MTJL. The bottom electrode layer 30 may be formed by a sputtering, a chemical vapor deposition, or an atomic layer deposition.

The magnetic tunnel junction layer MTJL may include a first magnetic layer 40, a tunnel barrier layer 50, and a second magnetic layer 60 that are sequentially stacked on the bottom electrode layer 30. One of the first and second magnetic layers 40 and 60 may correspond to a reference layer having a unidirectionally fixed magnetization direction, and the other of the first and second magnetic layers 40 and 60 may correspond to a free layer having a variable magnetization direction that can be changed to be parallel or anti-parallel to the fixed magnetization direction.

For example, the magnetization directions of the reference and free layers may be substantially perpendicular to an interface between the tunnel barrier layer 50 and the second magnetic layer 60. That is, the magnetization directions of the reference and free layers may be substantially perpendicular to a plane formed by the first direction D1 and the second direction D2. In this case, the reference and free layers may include a perpendicular magnetic material (e.g., CoFeTb, CoFeGd, CoFeDy), a perpendicular magnetic material having an L10 structure, CoPt of a hexagonal close packed (HCP) lattice structure, and/or a perpendicular magnetic structure. The perpendicular magnetic material having an L10 structure may include FePt of an L10 structure, FePd of an L10 structure, CoPd of an L10 structure, and/or CoPt of an L10 structure. The perpendicular magnetic structure may include magnetic layers and non-magnetic layers that are alternately and repeatedly stacked. For example, the perpendicular magnetic structure may include (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n (in which n is a number of stacked layers). Here, the reference layer may have a thickness that is greater than the thickness of the free layer, and/or may have a coercive force greater than that of the free layer.

Alternatively, the magnetization directions of the reference and free layers may be substantially parallel to the interface between the tunnel barrier layer 50 and the second magnetic layer 60. That is, the magnetization directions of the reference and free layers may be substantially parallel to a plane formed by the first direction D1 and the second direction D2. In this case, the reference and free layers may include a ferromagnetic material. The reference layer may further include an antiferromagnetic material for fixing a magnetization direction of the ferromagnetic material in the reference layer.

The tunnel barrier layer 50 may include a magnesium (Mg) oxide layer, a titanium (Ti) oxide layer, an aluminum (Al) oxide layer, a magnesium-zinc (Mg—Zn) oxide layer, and/or a magnesium-boron (Mg—B) oxide layer.

Each of the first magnetic layer 40, the tunnel barrier layer 50, and the second magnetic layer 60 may be formed by a physical vapor deposition or a chemical vapor deposition.

The top electrode layer 70 may include tungsten, titanium, tantalum, aluminum, and/or metal nitride (e.g., titanium nitride and/or tantalum nitride). The top electrode layer 70 may be formed by a physical vapor deposition or a chemical vapor deposition.

A plurality of first line mask patterns MP1 may be formed on the top electrode layer 70 (S20). The first line mask patterns MP1 may have a line shape that extends in a first direction D1 and may be spaced apart from each other in a second direction D2 that crosses (e.g., that is perpendicular to) the first direction D1. The first line mask patterns MP1 may be a photoresist pattern or a hard-mask pattern that includes silicon oxide, silicon nitride, and/or silicon oxynitride. In one embodiment, the first line mask patterns MP may be a hard-mask pattern.

Figure 5A:
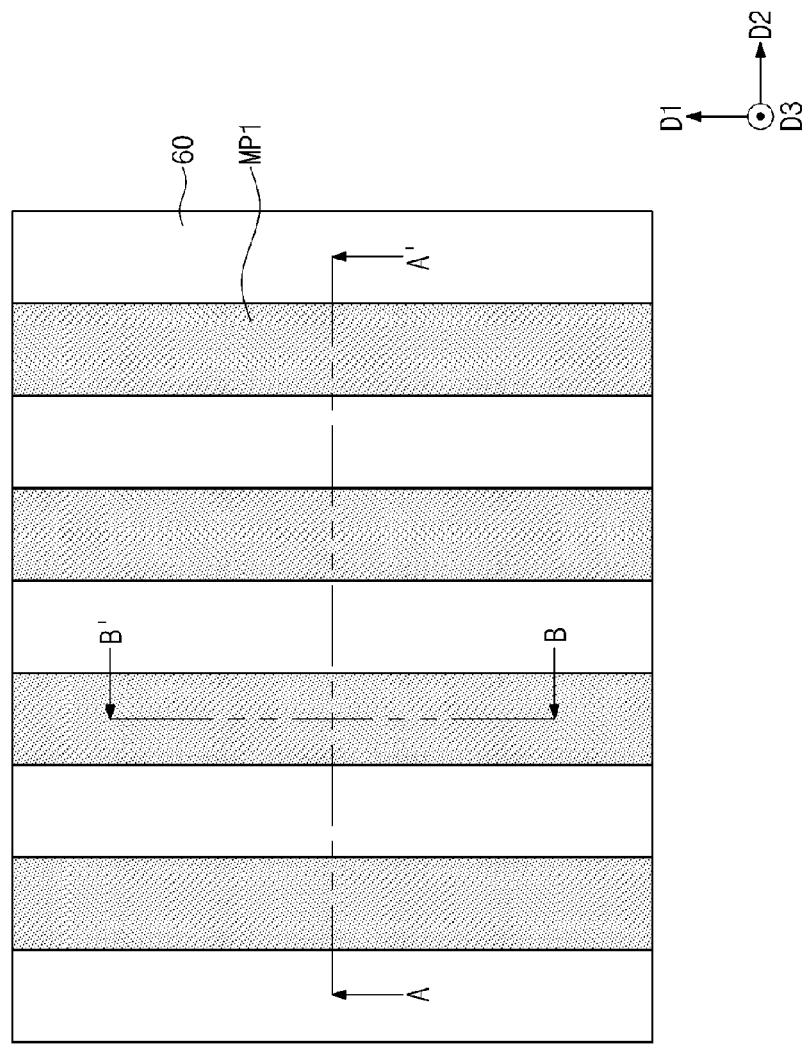
Figure 5B:
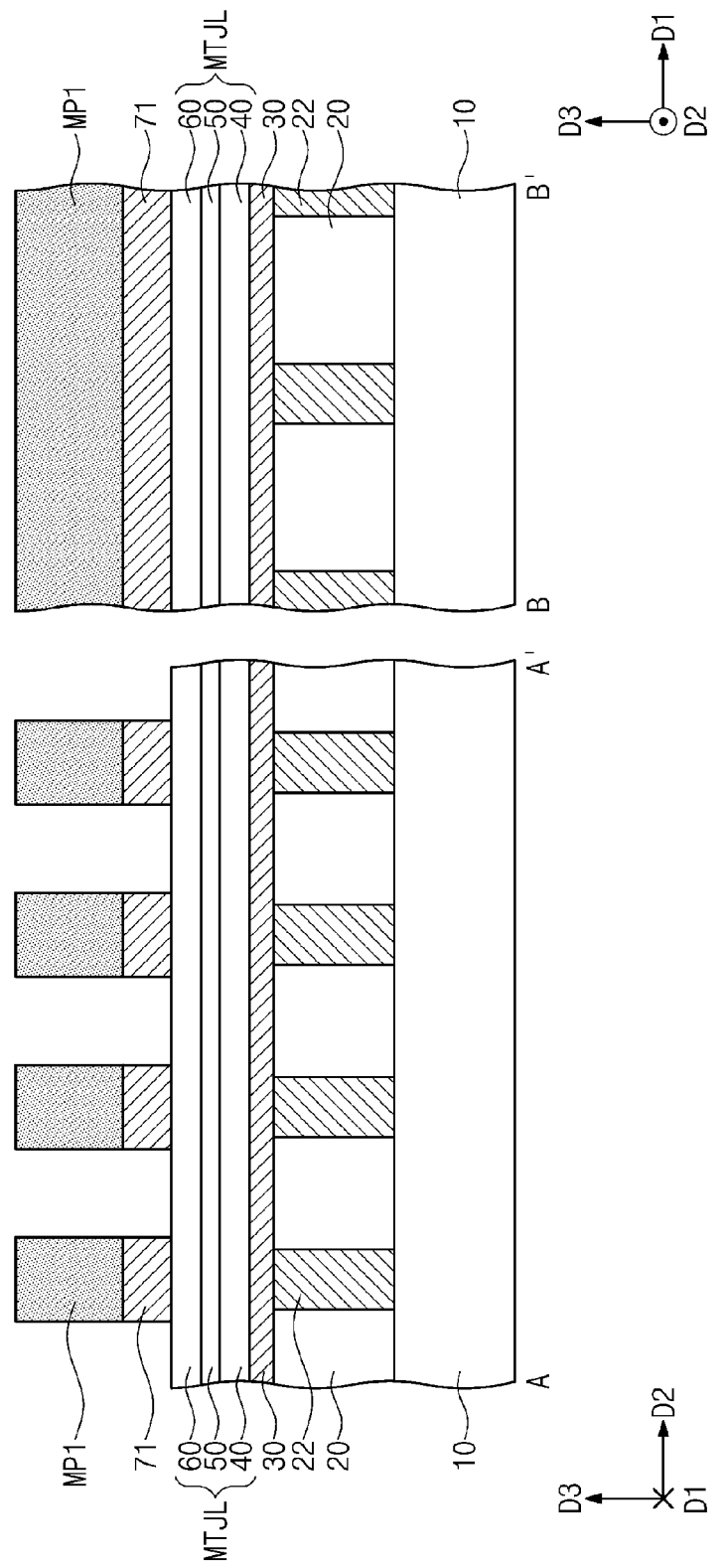

Referring to FIGS. 3, 5A and 5B, a plurality of preliminary top electrode patterns 71 may be formed by performing a first etch process using the first line mask patterns MP1 as an etch mask (S30). For example, the first etch process may be a plasma-etch process or a reactive-ion etch process. The first etch process may etch the top electrode layer 70 to form the preliminary top electrode patterns 71 through which the second magnetic layer 60 is exposed. The preliminary top electrode patterns 71 may have a line shape that extends in the first direction D1 and may be spaced apart from each other in the second direction D2. The first line mask patterns MP1 may remain after the first etch process.

Figure 6B:
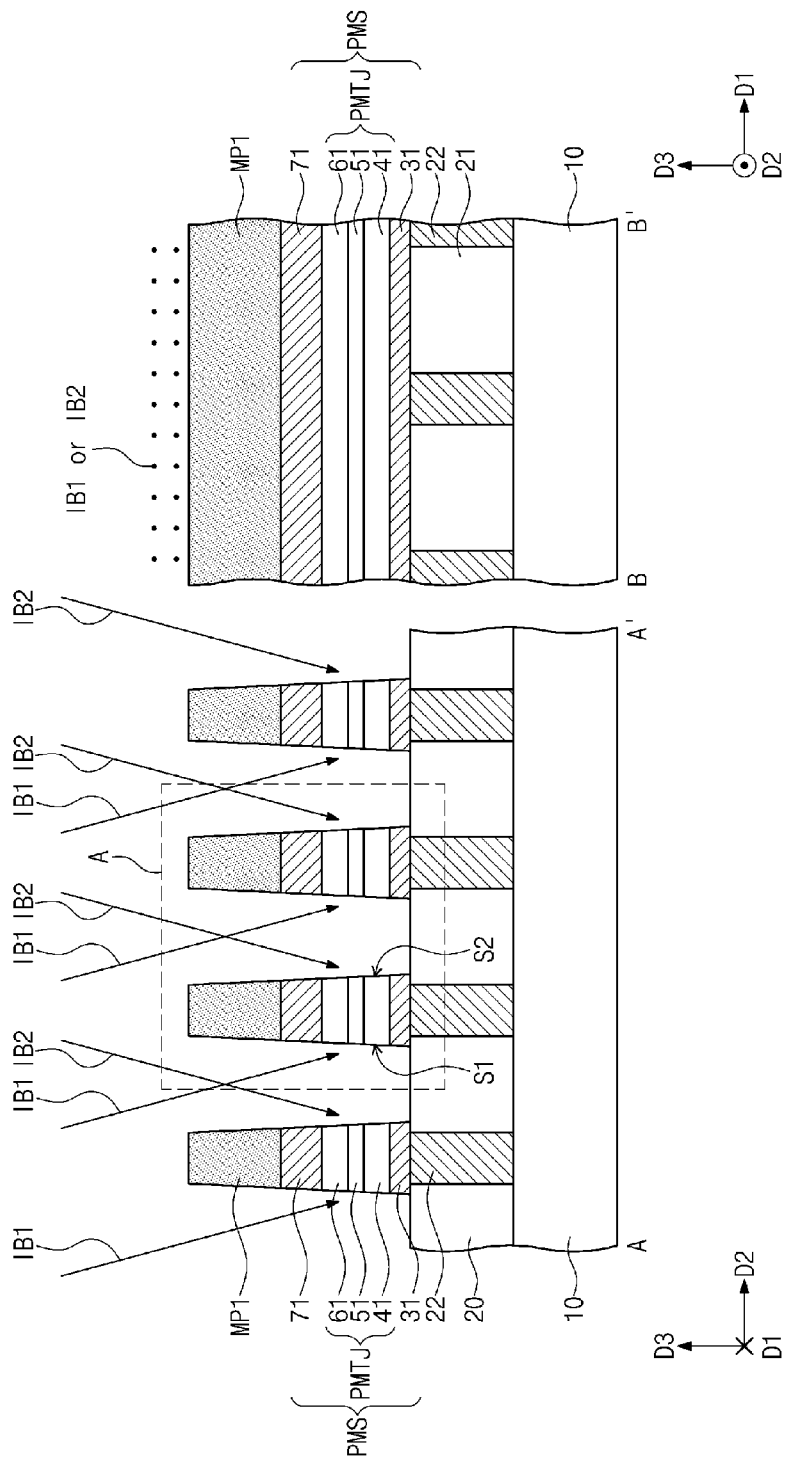
Figure 7A:
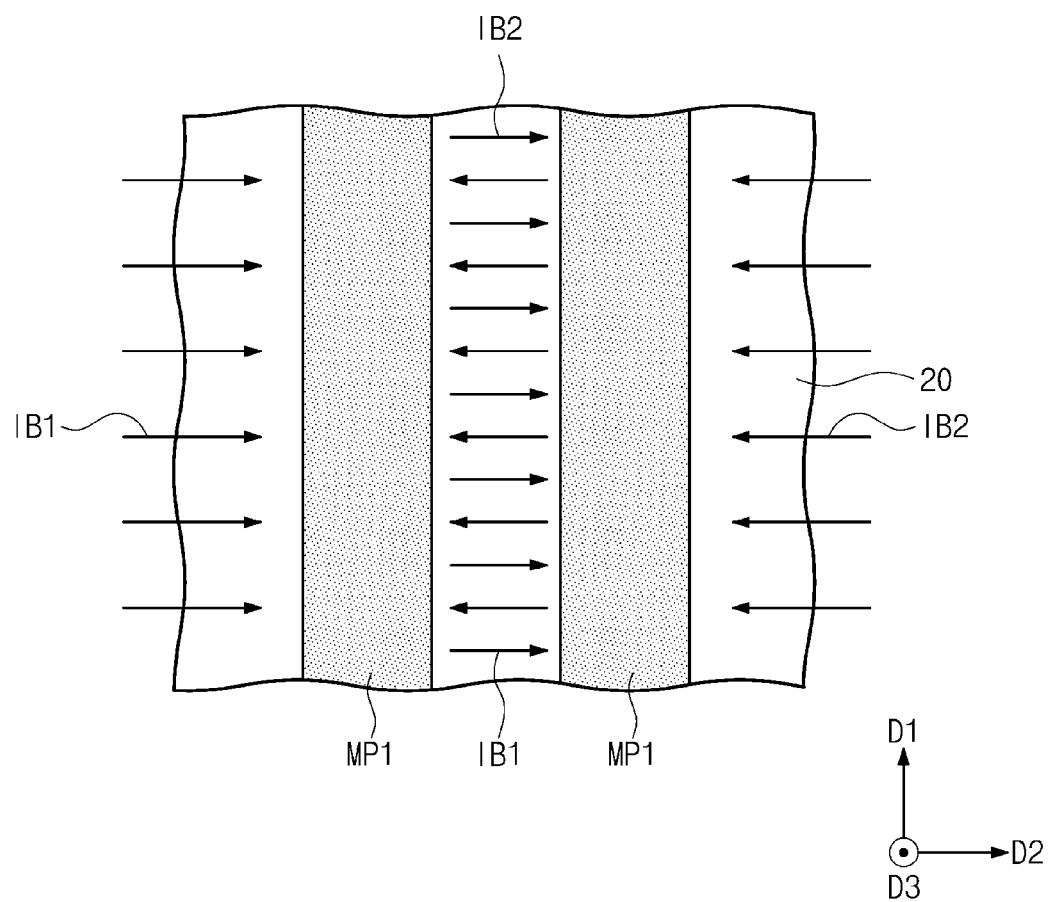
FIG. 7A depicts a plan view for explaining incident directions of first and second ion beams.
Figure 7B:
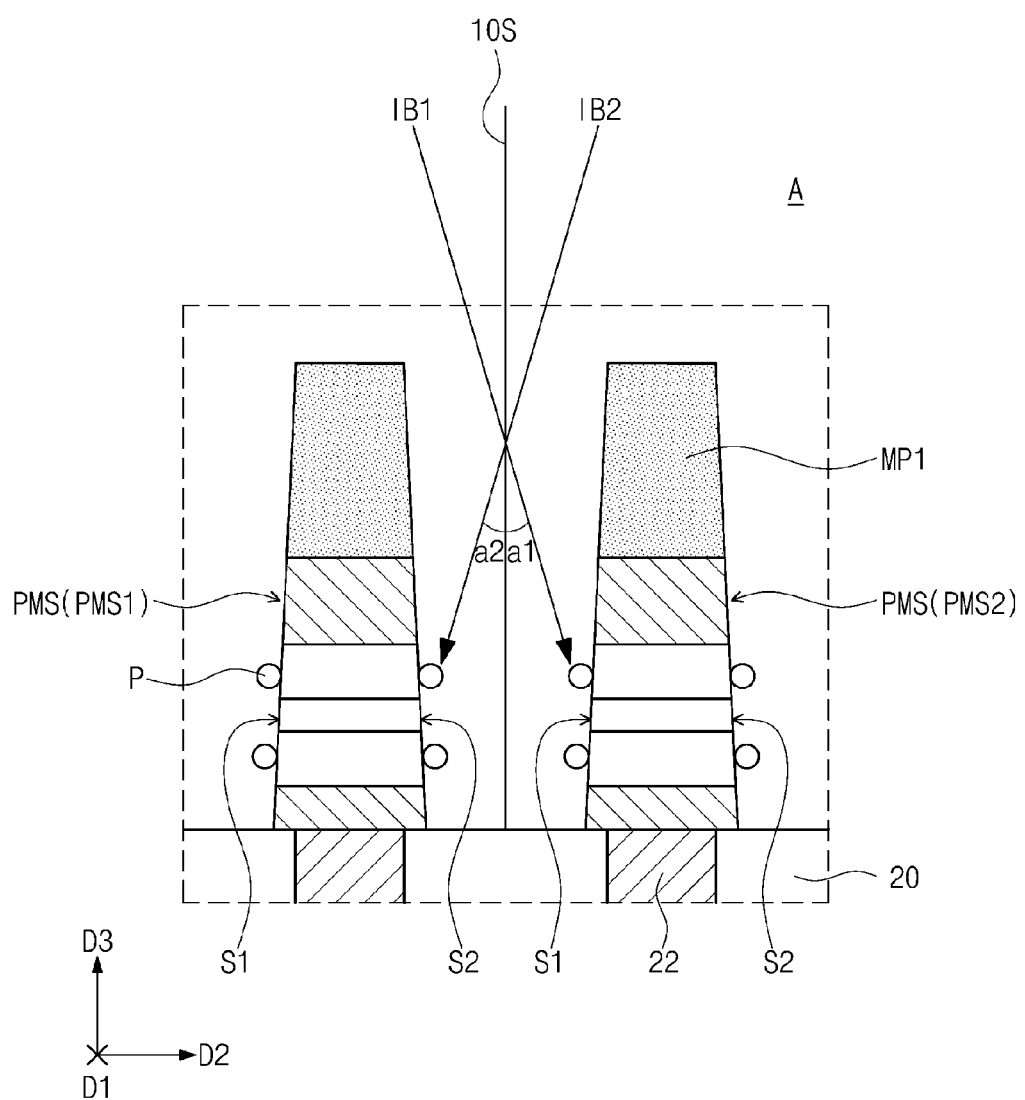
FIG. 7B depicts an enlarged view illustrating a portion A of FIG. 6B.

Referring to FIGS. 3, 6A and 6B, a plurality of preliminary magnetic tunnel junction structures PMS may be formed by performing a second etch process using the remaining first line mask patterns MP1 as an etch mask (S40). Each of the preliminary magnetic tunnel junction structures PMS may include a preliminary bottom electrode pattern 31, a preliminary first magnetic pattern 41, a preliminary tunnel barrier pattern 51, a preliminary second magnetic pattern 61, and the preliminary top electrode pattern 71 that are sequentially stacked on the lower interlayer dielectric layer 20. The preliminary first magnetic pattern 41, the preliminary tunnel barrier pattern 51, and the preliminary second magnetic pattern 61 may be defined as a preliminary magnetic tunnel junction PMTJ. The preliminary magnetic tunnel junction structures PMS may have a line shape that extends in the first direction D1 and may be spaced apart from each other in the second direction D2.

The second etch process may be performed using an ion-beam etch process. In an embodiment, as shown in FIG. 7B, the second etch process may be performed using an ion beam that is obliquely incident toward the substrate 10 at an angle with respect to a third direction D3 (i.e., a normal line 10S that is perpendicular to a top surface of the dielectric layer 20) that is perpendicular to the first and second directions D1 and D2. For example, the ion beam of the second etch process may include a first ion beam IB1 having a first incident angle a1 with respect to the normal line 10S and a second ion beam IB2 having a second incident angle a2 with respect to the normal line 10S. In one embodiment, the normal line 10S may be perpendicular or substantially perpendicular to the plane formed by the first direction D1 and the second direction D2. The first and second ion beams IB1 and IB2 may be substantially reciprocally symmetric with respect to the normal line 10S, and the first and second incident angles a1 and a2 may be substantially the same angle with respect to the normal line 10S. Additionally, incident directions of the first and second ion beams IB1 and IB2 may each have a component that may be substantially parallel to a plane defined by the second and third directions D2 and D3. In other words, from the plan view shown in FIG. 7A, the incident direction of the first ion beam IB1 may have a vector component in the second direction D2 and the incident direction of the second ion beam IB2 may have a vector component in a direction that is opposite to the second direction D2. That is, the incident direction of the first ion beam IB1 may not have a vector component that is in the same direction as the vector component of the second ion beam IB2, and the incident direction of the second ion beam IB2 may not have a vector component that is in the same direction as the vector component of the first ion beam IB1. Additionally, the incident directions of the first and second ion beams IB1 and IB2 may have neither the vector component in the first direction D1 nor the vector component in the opposite direction to the first direction D1. It may be possible to adjust as needed the first incident angle a1 of the first ion beam IB1 and the second incident angle a2 of the second ion beam IB2. A reactive gas (e.g., oxygen) or a non-reactive gas (e.g., nitrogen or argon) may be employed as a source gas to generate the first and second ion beams IB1 and IB2.

In summary, the second etch process using the first and second ion beams IB1 and IB2 may sequentially etch the second magnetic layer 60, the tunnel barrier layer 50, the first magnetic layer 40, and the bottom electrode layer 30 to form the preliminary second magnetic pattern 61, the preliminary tunnel barrier pattern 51, the preliminary first magnetic pattern 41, and the preliminary bottom electrode pattern 31. Sidewalls of the preliminary top electrode pattern 71 may be partially etched during the second etch process.

Each of the preliminary magnetic tunnel junction structures PMS formed by the second etch process may include a first sidewall S1 and a second sidewall S2 facing each other in the second direction D2. That is, a first sidewall S1 of a preliminary magnetic tunnel junction structure PMS faces the second sidewall S2 of an adjacent preliminary magnetic tunnel junction structure PMS. The first ion beam IB1 may etch one side of the second magnetic layer 60, the tunnel barrier layer 50, the first magnetic layer 40, and the bottom electrode layer 30, and thus the first sidewall S1 may be formed. And, the second ion beam IB2 may etch the other side of the second magnetic layer 60, the tunnel barrier layer 50, the first magnetic layer 40, and the bottom electrode layer 30, and thus the second sidewall S2 may be formed.

In the case that the magnetic structure MLS of FIG. 4B is etched, an etch byproduct P may be created. The reason for this may originate in that the magnetic structure MLS may comprise the layers 30, 40, 50, 60 and 70 that have etching characteristics that are different from each other. As shown in FIG. 7B, an etch byproduct P may be produced in the course of forming a pair of adjacent preliminary magnetic tunnel junction structures PMS (also referred hereinafter to as first and second preliminary magnetic tunnel junction structures PMS1 and PMS2), and the etch byproduct P that is produced may be redeposited on the first and second sidewalls S1 and S2 of the first and second preliminary magnetic tunnel junction structures PMS1 and PMS2. For example, while the first sidewall S1 of the second magnetic tunnel junction structure PMS2 is formed by the first ion beam IB1, the etch byproduct P may be produced and redeposited on the second sidewall S2 of the first magnetic tunnel junction structure PMS1. Likewise, while the second sidewall S2 of the first magnetic tunnel junction structure PMS1 is formed by the second ion beam IB2, the etch byproduct P may be produced and redeposited on the first sidewall S1 of the second magnetic tunnel junction structure PMS2. The etch byproduct P may lead to an electrical short during the operation of the magnetic tunnel junction and may cause failure of a magnetic memory device.

Unlike a case in which an island-shaped mask pattern is used as an etch mask (in which the substrate 10 is rotated during the etching of the magnetic structure MLS), the substrate 10 may not rotate if the magnetic structure MLS is etched by the second etch process using the line-shaped mask pattern as an etch mask according to the present embodiment. In an embodiment, the first and second ion beams IB1 and IB2 may respectively be continuously incident onto the first and second sidewalls S1 and S2 of the preliminary magnetic tunnel junction structures PMS during the second etch process, and thus may effectively remove the etch byproduct P that may be redeposited on the first and second sidewalls S1 and S2. In conclusion, it may be advantageous to form a magnetic tunnel junction structure in this manner to provide enhanced electrical characteristics and reliability of a magnetic tunnel junction structure that is subsequently formed.

Alternatively, unlike the above description, the preliminary magnetic tunnel junction structures PMS may be formed by performing the second etch process instead of the first etch process at S30 in FIG. 3. In other words, the second etch process may be performed to form the preliminary magnetic tunnel junction structures PMS by sequentially etching the top electrode layer 70, the second magnetic layer 60, the tunnel barrier layer 50, the first magnetic layer 40, and the bottom electrode layer 30 that are exposed by the first line mask patterns MP1.

Figure 8A:
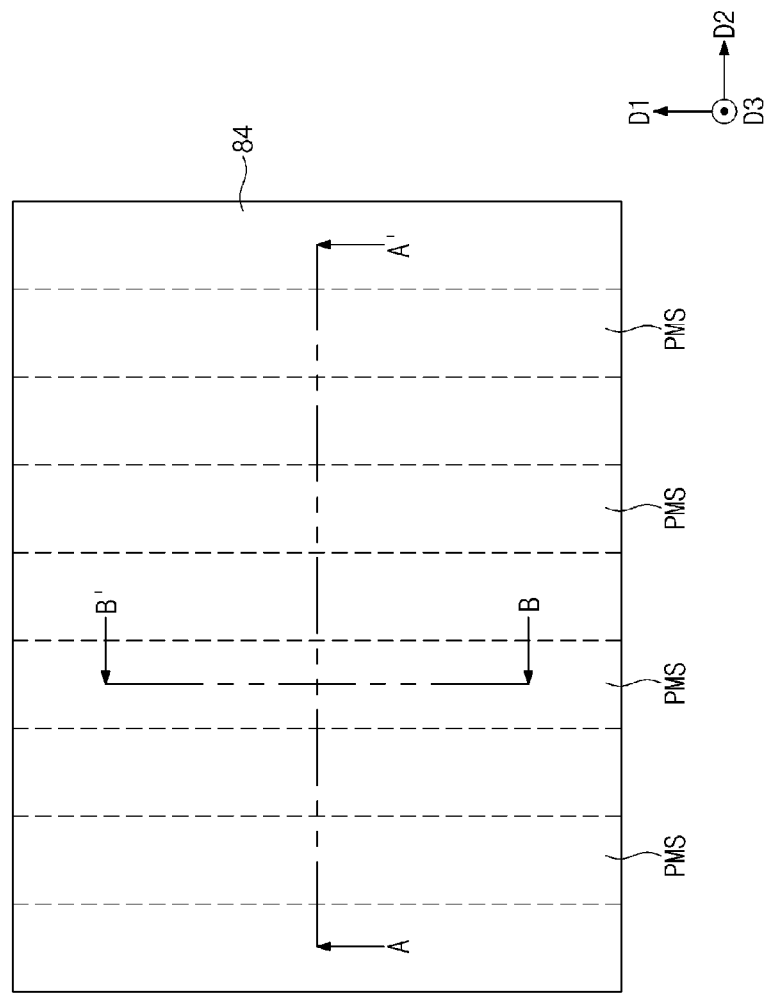
Figure 8B:
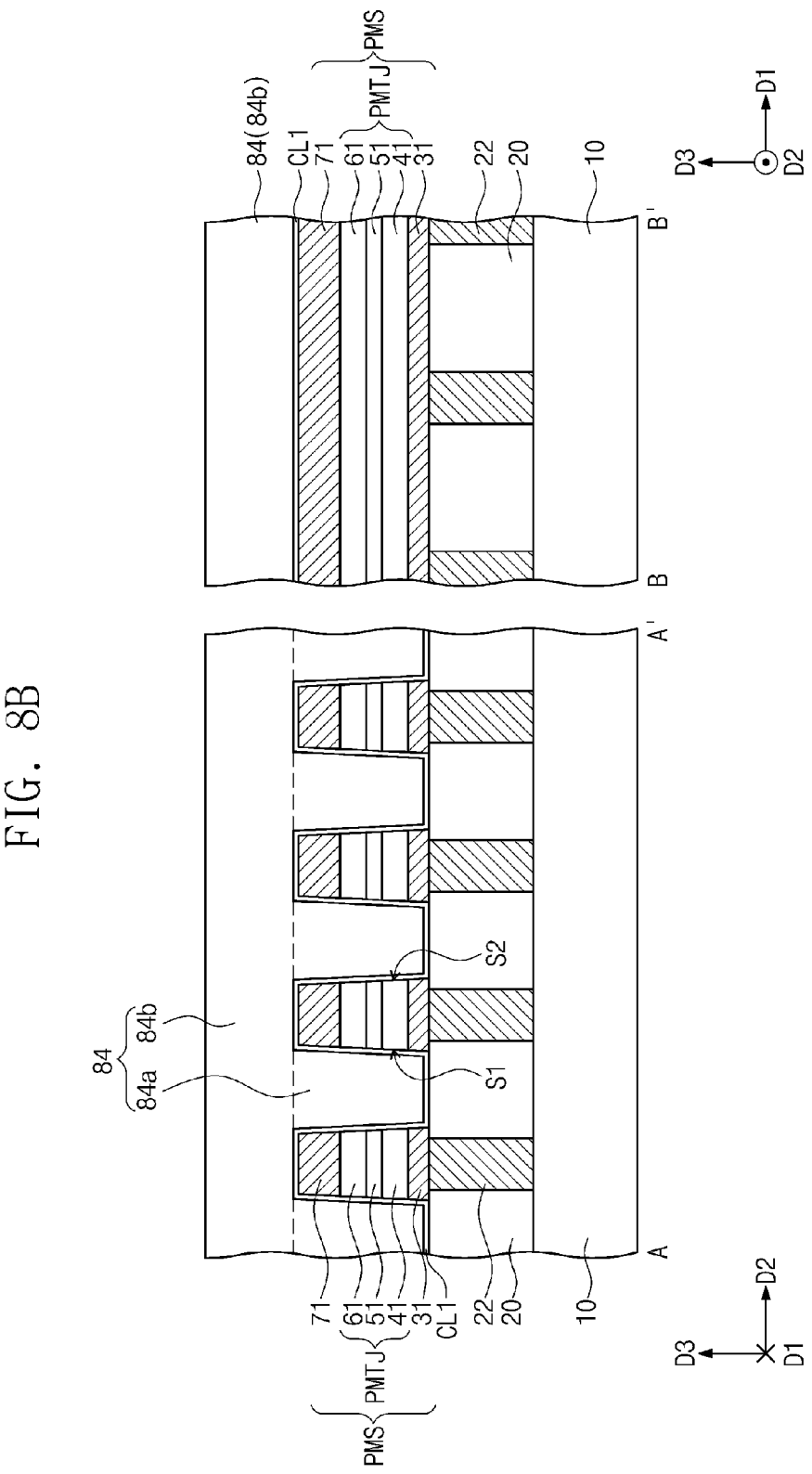

Referring to FIGS. 3, 8A and 8B, the first line mask patterns MP1 may be removed. Thereafter, a first capping insulation layer CL1 may be formed on the preliminary magnetic tunnel junction structures PMS. The first capping insulation layer CL1 may cover top surfaces and the first and second sidewalls S1 and S2 of the preliminary magnetic tunnel junction structures PMS, and may extend onto a top surface of the lower interlayer dielectric layer 20 between the preliminary magnetic tunnel junction structures PMS. The first capping insulation layer CL1 may be formed to prevent oxidation of the first and second sidewalls S1 and S2 of the preliminary magnetic tunnel junction structures PMS. The first capping insulation layer CL1 may include, for example, a silicon nitride and be formed by a chemical vapor deposition or an atomic layer deposition.

An upper interlayer dielectric layer 84 may be formed. The upper interlayer dielectric layer 84 may fill a gap between the preliminary magnetic tunnel junction structures PMS that are adjacent to each other and may cover the top surfaces of the preliminary magnetic tunnel junction structures PMS. For example, the upper interlayer dielectric layer 84 may include a first portion 84a positioned below a topmost portion of the first capping insulation layer CL1 (i.e., a top surface of the first capping insulation layer CL1 positioned above the top surfaces of the preliminary magnetic tunnel junction structures PMS) and a second portion 84b positioned at a level above the topmost portion of the first capping insulation layer CL1. The upper interlayer dielectric layer 84 may include, for example, a silicon oxide layer, and may be formed by a chemical vapor deposition or an atomic layer deposition. In an embodiment, a top surface of the upper interlayer dielectric layer 84 (i.e., a top surface of the second portion 84b) may be planarized. For example, an etch-back process or a chemical mechanical polishing (CMP) process may be performed to planarize the top surface of the upper interlayer dielectric layer 84. In this case, the planarized top surface of the upper interlayer dielectric layer 84 may be positioned at a level above the topmost portion of the first capping insulation layer CL1. Alternatively, the planarization of the upper interlayer dielectric layer 84 may be skipped.

Figure 9A:
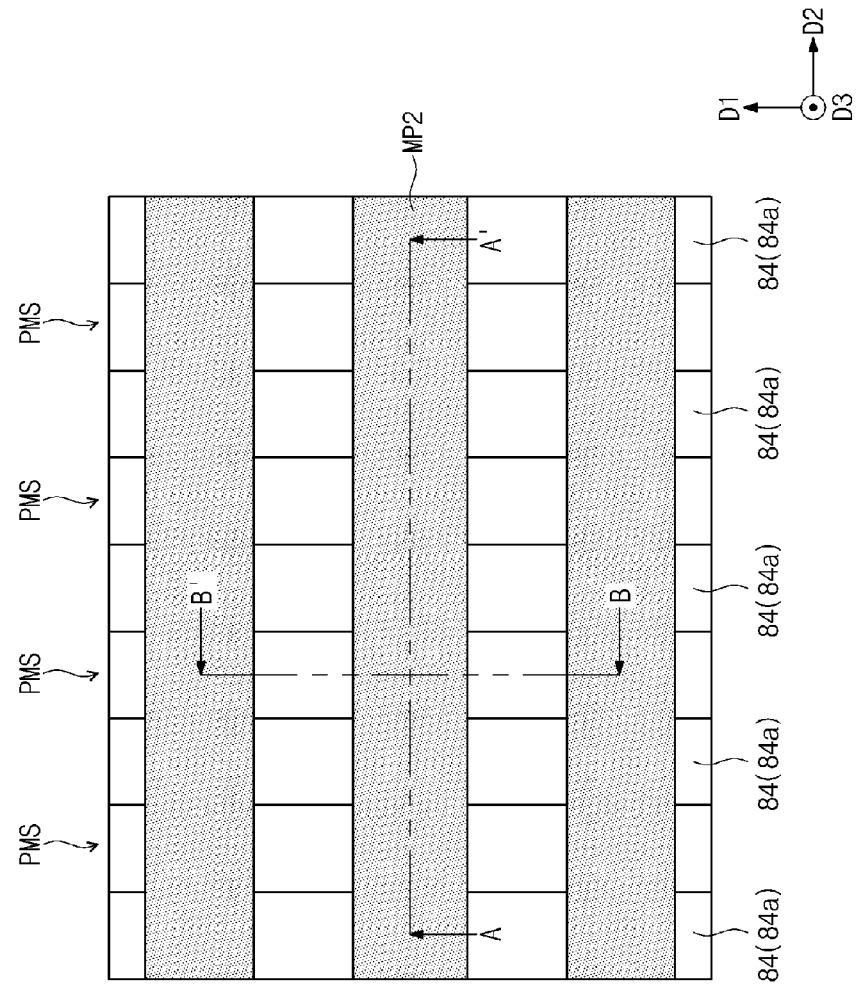
Figure 9B:
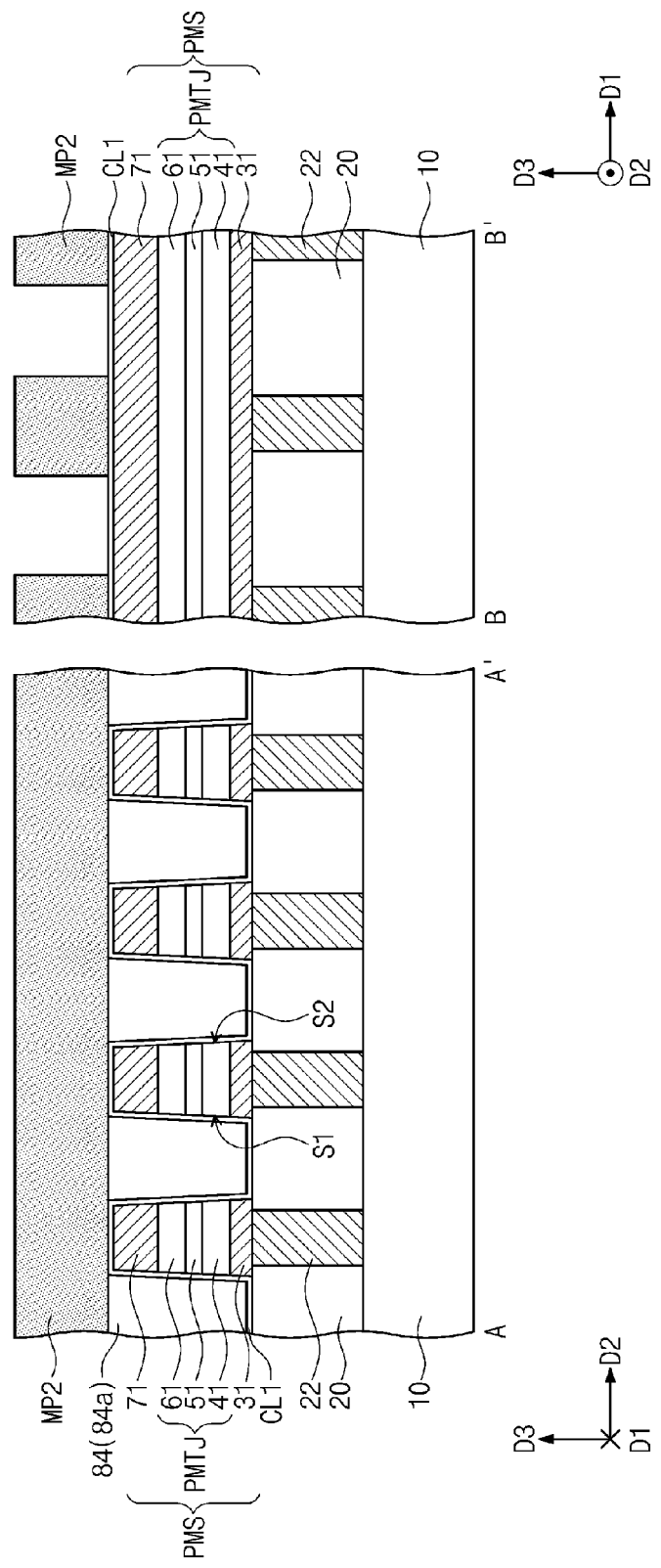

Referring to FIGS. 3, 9A and 9B, a plurality of second line mask patterns MP2 may be formed on the preliminary magnetic tunnel junction structures PMS (S50). The second line mask pattern MP2 may be formed to run across the preliminary magnetic tunnel junction structures PMS. In other words, the second line mask patterns MP2 may have a line shape that extends in the second direction D2 and may be spaced apart from each other in the first direction D1. The second line mask patterns MP2 may expose a portion of the first capping insulation layer CL1 and the first portion 84a of the upper interlayer dielectric layer 84 between the preliminary magnetic tunnel junction structures PMS that are adjacent to each other.

In an embodiment, the second line mask patterns MP2 may be formed by patterning the second portion 84b of the upper interlayer dielectric layer 84. For example, the second portion 84b of the upper interlayer dielectric layer 84 may be patterned by forming a photoresist pattern (not shown) on the second portion 84b of the upper interlayer dielectric layer 84 and then performing an etch process using the photoresist pattern as an etch mask. Alternatively, the second line mask patterns MP2 may be formed by planarizing the upper interlayer dielectric layer 84 to selectively remove the second portion 84b, forming a mask layer (not shown) on the upper interlayer dielectric layer 84, and then patterning the mask layer. In this case, the mask layer may be formed on the upper interlayer dielectric layer 84 after the second portion 84b has been removed. The mask layer may include, for example, a silicon oxide.

Figure 10A:
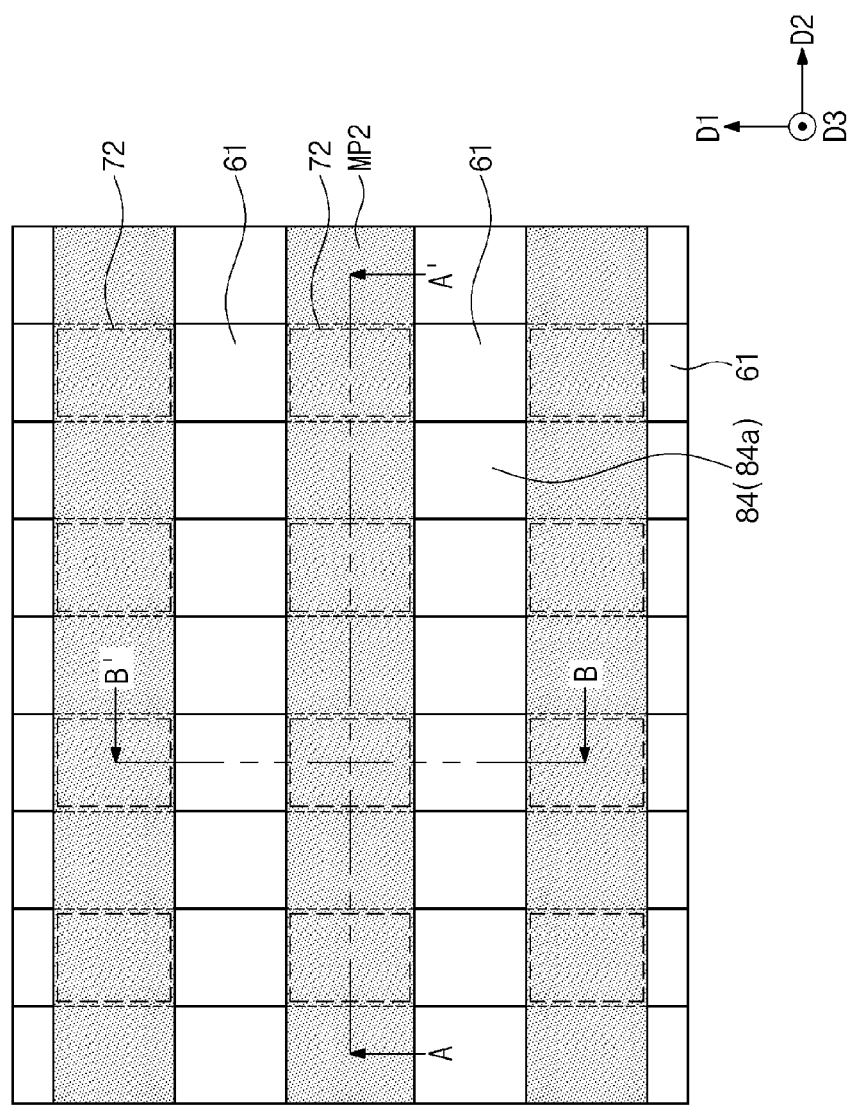
Figure 10B:
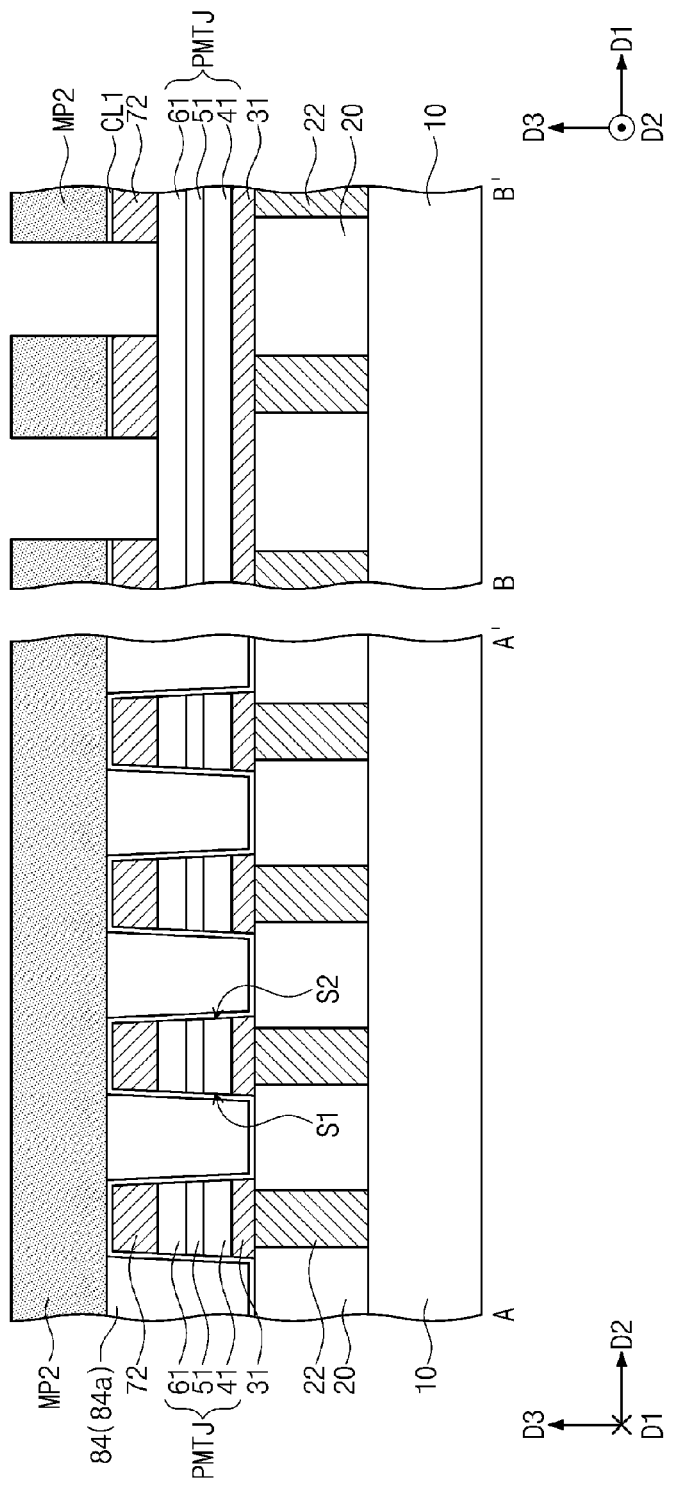

Referring to FIGS. 3, 10A and 10B, a plurality of top electrode patterns 72 may be formed by performing a third etch process using the second line mask patterns MP2 as an etch mask (S60). The third etch process may include sequentially etching the first capping insulation layer CL1 and the preliminary top electrode pattern 71 that are exposed by the second line mask patterns MP2. The third etch process may be performed until the preliminary second magnetic patterns 61 are exposed. The third etch process may be, for example, a dry-etch process, such as a plasma-etch process or a reactive-ion etch process. The top electrode patterns 72 may be disposed in a shape of an island that is spaced apart from each other in the first and second directions D1 and D2. The second mask patterns MP2 may remain after the third etch process.

Figure 11A:
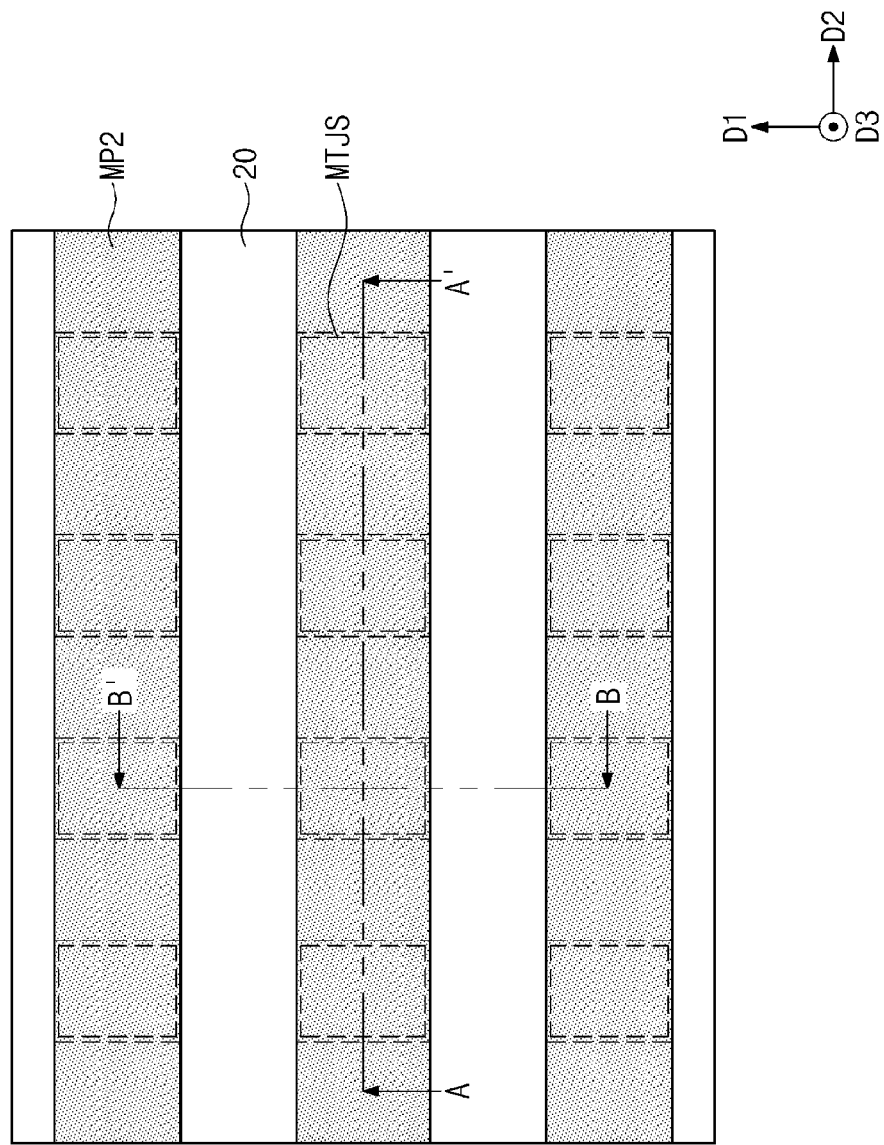
Figure 11B:
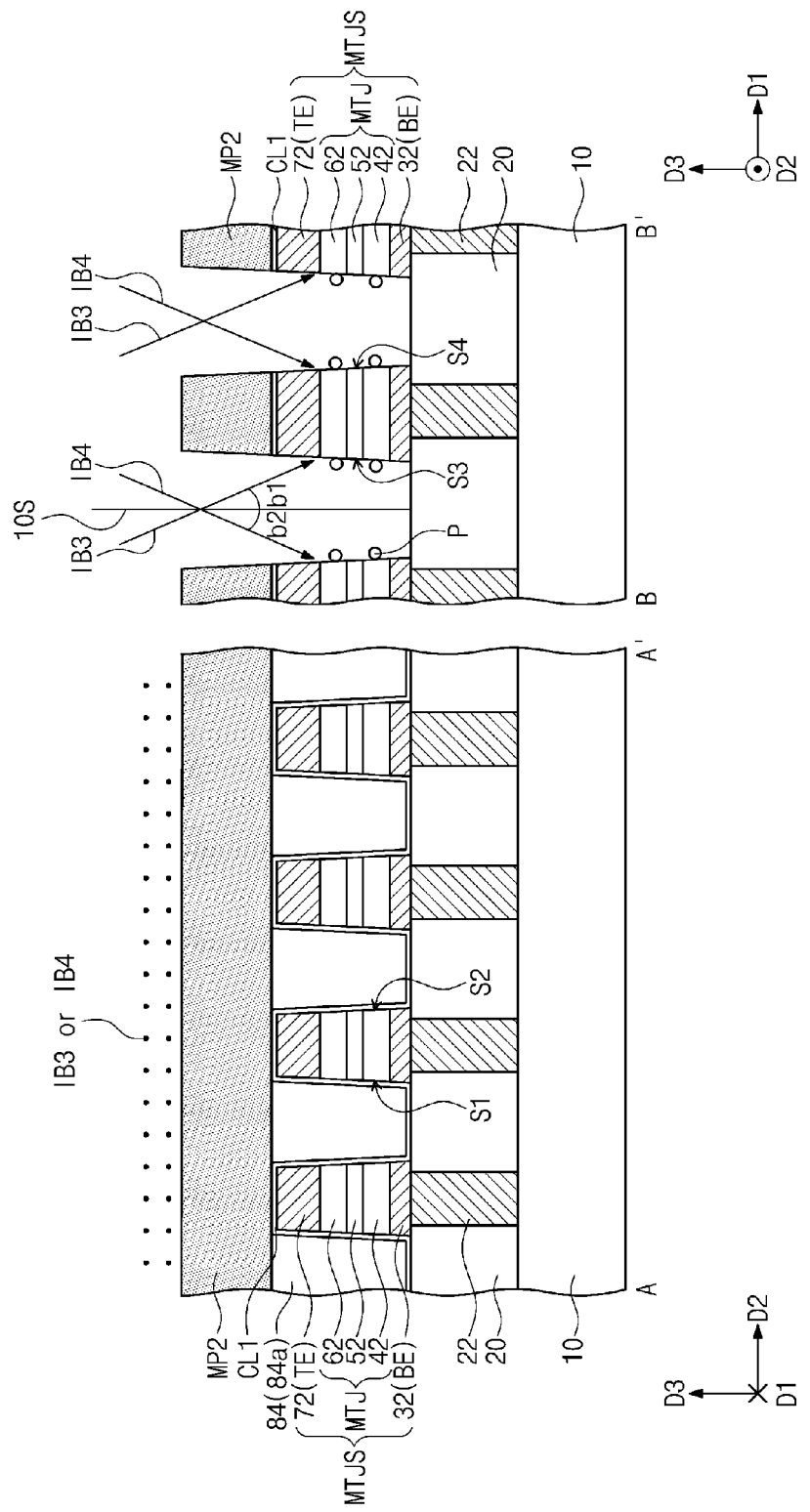
Figure 12:
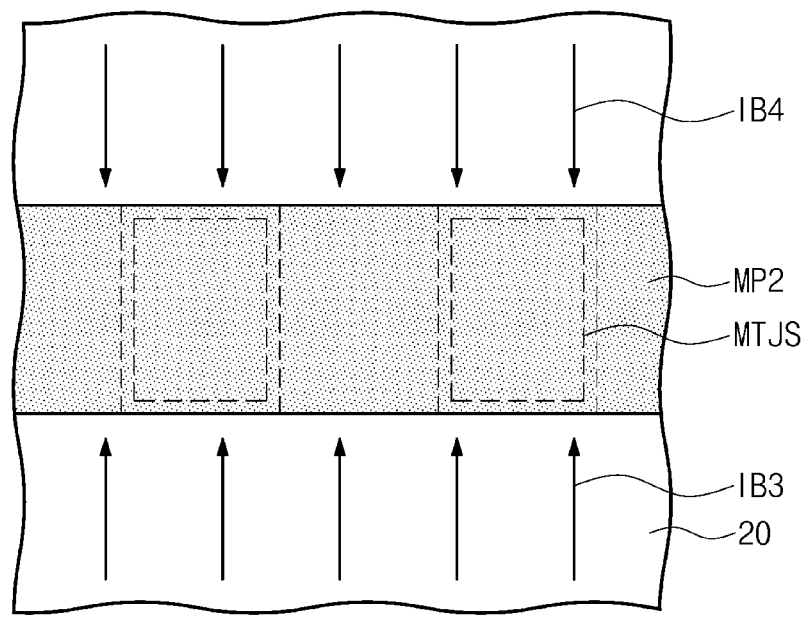
FIG. 12 depicts a plan view for explaining incident directions of third and fourth ion beams.
Figure 12:
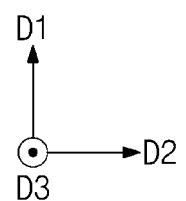

Referring to FIGS. 3, 11A and 11B, a plurality of magnetic tunnel junction structures MTJS may be formed by performing a fourth etch process using the remaining second line mask patterns MP2 as an etch mask (S70). Each of the magnetic tunnel junction structures MTJS may include a bottom electrode pattern 32, a first magnetic pattern 42, a tunnel barrier pattern 52, a second magnetic pattern 62, and the top electrode pattern 72 that are sequentially stacked on the lower interlayer dielectric layer 20. The first magnetic pattern 42, the tunnel barrier pattern 52, and the second magnetic pattern 62 may be defined as a magnetic tunnel junction MTJ. The bottom electrode pattern 32 may be referred to as a bottom electrode BE, and the top electrode pattern 72 may be referred to as a top electrode TE. The magnetic tunnel junction structures MTJS may be disposed in a shape of an island that is spaced apart from each other in the first and second directions D1 and D2. The magnetic tunnel junction structures MTJS may correspond to the memory device ME discussed with reference to FIG. 2.

In some embodiments, the fourth etch process may be performed using an ion-beam etch process. In detail, likewise to the second etch process, the fourth etch process may be performed using an ion beam that is obliquely incident toward the substrate 10 at an angle to the normal line 10S that is perpendicular to the top surface of the dielectric layer 20. For example, the ion beam of the fourth etch process may include a third ion beam IB3 having a third incident angle b1 with respect to the normal line 10S and a fourth ion beam IB4 having a fourth incident angle b2 with respect to the normal line 10S. In one embodiment, the normal line 10S may be perpendicular or substantially perpendicular to the plane formed by the first direction D1 and the second direction D2. The third and fourth ion beams IB3 and IB4 may be substantially reciprocally symmetric with respect to the normal line 10S, and the third and fourth incident angles b1 and b2 may be substantially the same angle with respect to the normal line 10S. Additionally, incident directions of the third and fourth ion beams IB3 and IB4 may each have a component that may be substantially parallel to a second plane by the first and third directions D1 and D3. In other words, from the plan view shown in FIG. 12, the incident direction of the third ion beam IB3 may have a vector component in the first direction D1 and the incident direction of the fourth ion beam IB4 may have a vector component in a direction that is opposite to the first direction D1. That is, the incident direction of the third ion beam IB3 may not have a vector component that is in the same direction as the vector component of the fourth ion beam IB4, and the incident direction of the fourth ion beam IB4 may not have a vector component that is in the same direction as the vector component of the third ion beam IB3. Additionally, the incident directions of the third and fourth ion beams IB3 and IB4 may have neither the vector component in the second direction D2 nor the vector component in the inverse direction to the second direction D2. It may be possible to adjust as needed the third incident angle b1 of the third ion beam IB3 and the fourth incident angle b2 of the fourth ion beam IB4. A reactive gas (e.g., oxygen) or a non-reactive gas (e.g., nitrogen or argon) may be employed as a source gas to generate the third and fourth ion beams IB3 and IB4.

In brief, the fourth etch process using the third and fourth ion beams IB3 and IB4 may sequentially etch the preliminary second magnetic pattern 61, the preliminary tunnel barrier pattern 51, the preliminary first magnetic pattern 41, and the preliminary bottom electrode pattern 31 to form the second magnetic pattern 62, the tunnel barrier pattern 52, the first magnetic pattern 42, and the bottom electrode pattern 32. Sidewalls of the top electrode pattern 72 may be partially etched during the fourth etch process.

One of the first and second magnetic patterns 42 and 62 may correspond to a reference layer having a unidirectionally fixed magnetization direction, and the other of the first and second magnetic patterns 42 and 62 may correspond to a free layer having a variable magnetization direction that can be changed to be parallel or anti-parallel to the fixed magnetization direction.

For example, the magnetization directions of the reference and free layers may be substantially perpendicular to an interface between the tunnel barrier pattern 52 and the second magnetic pattern 62. That is, the magnetization directions of the reference and free layers may be substantially perpendicular to a plane formed by the first direction D1 and the second direction D2. In this case, the reference and free layers may include a perpendicular magnetic material (e.g., CoFeTb, CoFeGd, CoFeDy), a perpendicular magnetic material having an L10 structure, CoPt of a hexagonal close packed (HCP) lattice structure, and/or a perpendicular magnetic structure. The perpendicular magnetic material having an L10 structure may include at least one of FePt of an L10 structure, FePd of an L10 structure, CoPd of an L10 structure, and/or CoPt of an L10 structure. The perpendicular magnetic structure may include magnetic layers and non-magnetic layers that are alternately and repeatedly stacked. For example, the perpendicular magnetic structure may include (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n (in which n is a number of stacking layers). Here, the reference layer may have a thickness that is greater than the thickness of the free layer, and/or may have a coercive force greater than that of the free layer.

Alternatively, the magnetization directions of the reference and free layers may be substantially parallel to the interface between the tunnel barrier pattern 52 and the second magnetic pattern 62. That is, the magnetization directions of the reference and free layers may be substantially parallel to a plane formed by the first direction D1 and the second direction D2. In this case, the reference and free layers may include a ferromagnetic material. The reference layer may further include an antiferromagnetic material for fixing a magnetization direction of the ferromagnetic material in the reference layer.

Each of the magnetic tunnel junction structures MTJS may include a third sidewall S3 and a fourth sidewall S4 facing each other in the first direction D1 in addition to the first and second sidewalls S1 and S2 that were also previously described. During the fourth etch process, an etch byproduct P may be produced and redeposited on the third and fourth sidewalls S3 and S4 of the magnetic tunnel junction structures MTJS. However, according to exemplary embodiments disclosed herein, the third and fourth ion beams IB3 and IB4 may be respectively continuously incident onto the third and fourth sidewalls S3 and S3 during the fourth etch process, and thus may effectively remove the etch byproduct P redeposited on the third and fourth sidewalls S3 and S4.

Alternatively, the magnetic tunnel junction structures MTJS may be formed by performing the fourth etch process instead of the third etch process at S60. In other words, the discussed fourth etch process may be performed to form the magnetic tunnel junction structures MTJS by sequentially etching the preliminary top electrode pattern 71, the preliminary second magnetic pattern 61, the preliminary tunnel barrier pattern 51, the preliminary first magnetic pattern 41, and the preliminary bottom electrode pattern 31 that are exposed by the second line mask patterns MP2.

Figure 13B:
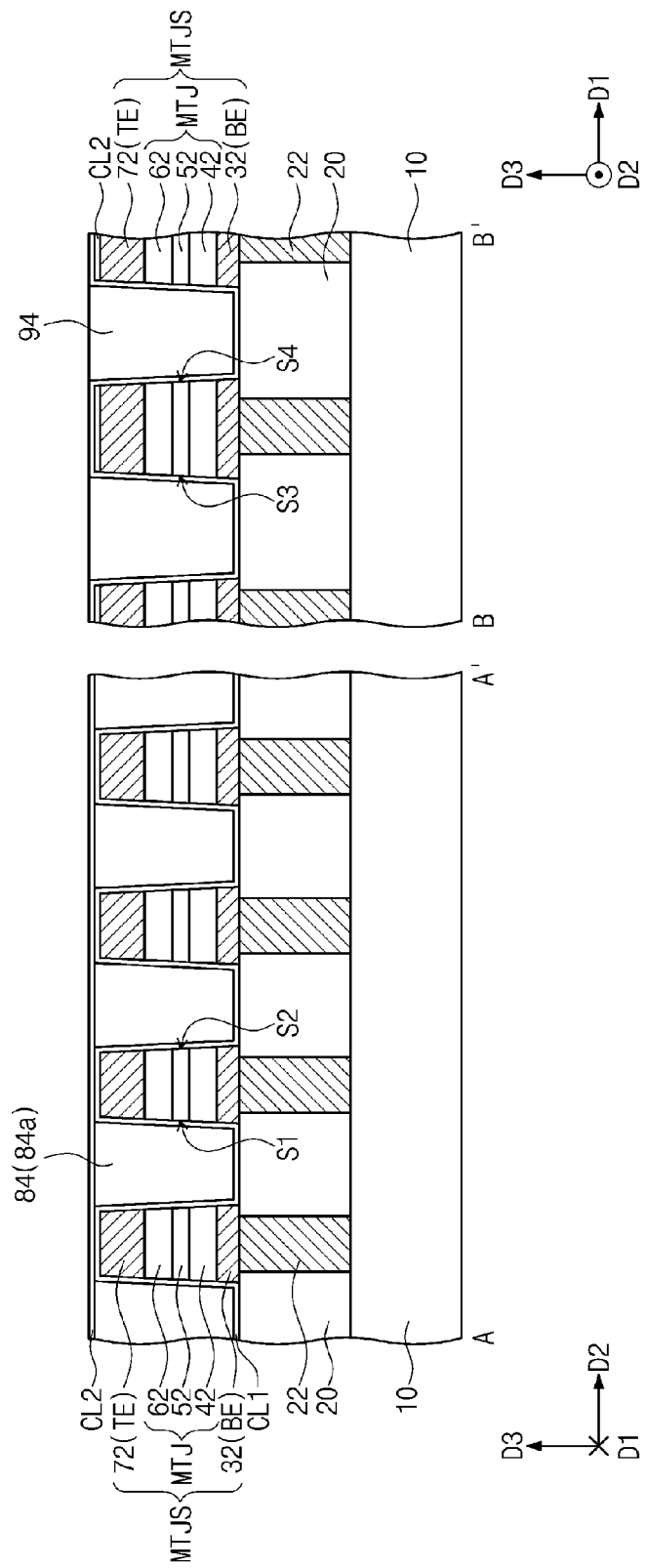

Referring to FIGS. 13A and 13B, after the second line mask patterns MP2 are removed, a second capping insulation layer CL2 may be formed on the magnetic tunnel junction structures MTJS. The second capping insulation layer CL2 may cover the third and fourth sidewalls S3 and S4 of the magnetic tunnel junction structures MTJS and extend onto a top surface of the magnetic tunnel junction structures MTJS on which the first capping insulation layer CL1 has been formed. The second capping insulation layer CL2 may also cover the top surface of the lower interlayer dielectric layer 20 that is exposed by the magnetic tunnel junction structures MTJS and a top surface of the upper interlayer dielectric layer 84 between the magnetic tunnel junction structures MTJS. The second capping insulation layer CL2 may be formed to prevent oxidation of the third and fourth sidewalls S3 and S4 of the magnetic tunnel junction structures MTJS. The second capping insulation layer CL2 may include, for example, a silicon nitride and be formed by a chemical vapor deposition or an atomic layer deposition.

A filling insulation layer 94 may be formed to fill a gap between the magnetic tunnel junction structures MTJS that are adjacent to each other in the first direction D1. The filling insulation layer 94 may be formed by forming an insulation layer to fill the gap between the adjacent magnetic tunnel junction structures MTJS and then planarizing the insulation layer to expose the second capping insulation layer CL2 on top surfaces of the magnetic tunnel junction structures MTJS. The filling insulation layer 94 may include, for example, a silicon oxide layer.

According to exemplary embodiments, the magnetic tunnel junction layer MTJL may be patterned by performing the ion-beam etch process twice, one of which uses the first line mask patterns MP1 extending in the first direction D1 as an etch mask and the other of which uses the second line mask patterns MP2 extending in the second direction D2 as an etch mask. These two-step etch processes may form the magnetic tunnel junctions MTJ configured in a shape of an island. During each of the ion-beam etch processes, the ion beams may be continuously incident onto the sidewalls of the magnetic tunnel junctions MTJ, and thus it may be possible to effectively remove the etch byproduct redeposited on the sidewalls of the magnetic tunnel junctions MTJ. Accordingly, the magnetic tunnel junctions MTJ may be formed to have enhanced electrical characteristics, and a magnetic memory device may be formed from the magnetic tunnel junctions MTJ may be provided with improved reliability.

Figure 14:
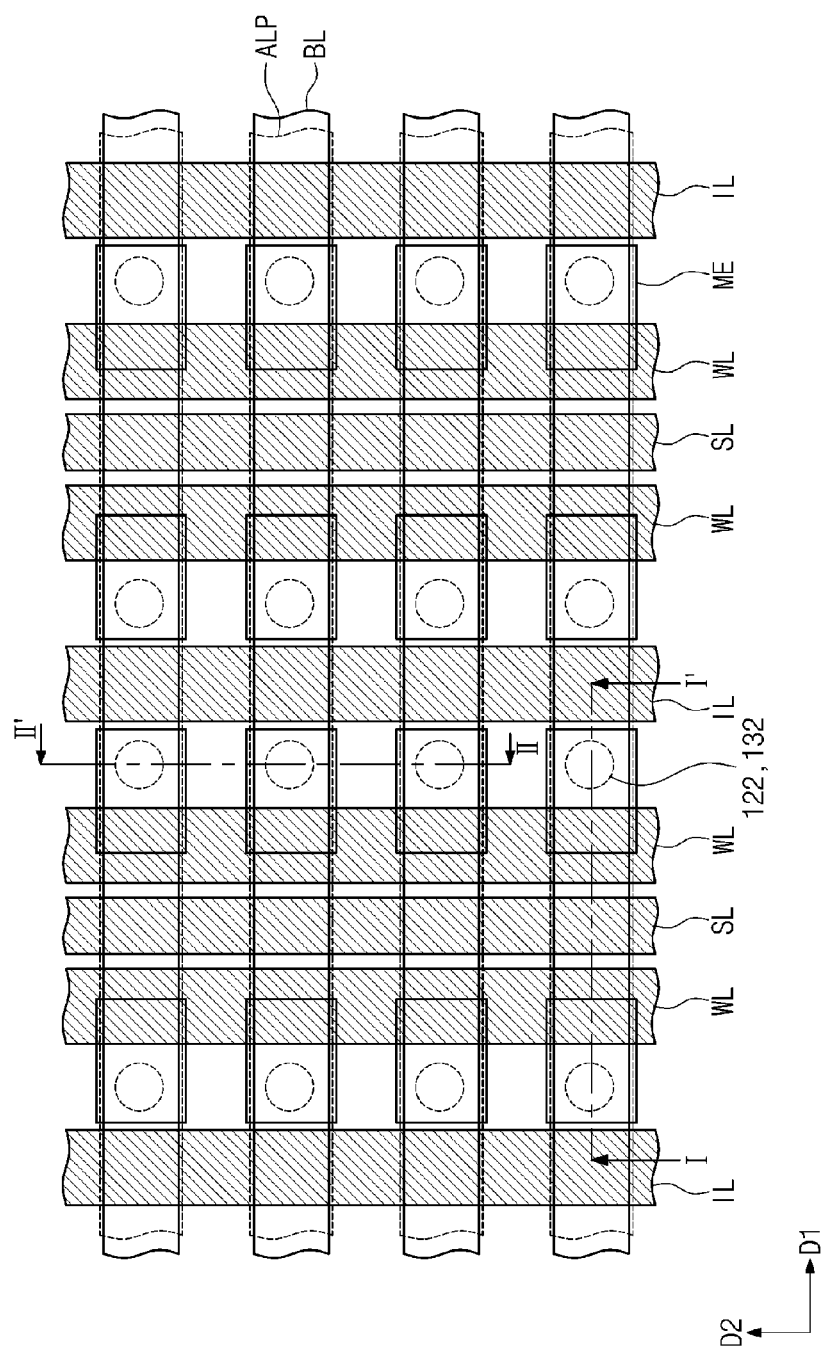
FIG. 14 depicts a plan view illustrating a magnetic memory device according to exemplary embodiments of the present inventive concept.
Figure 15:
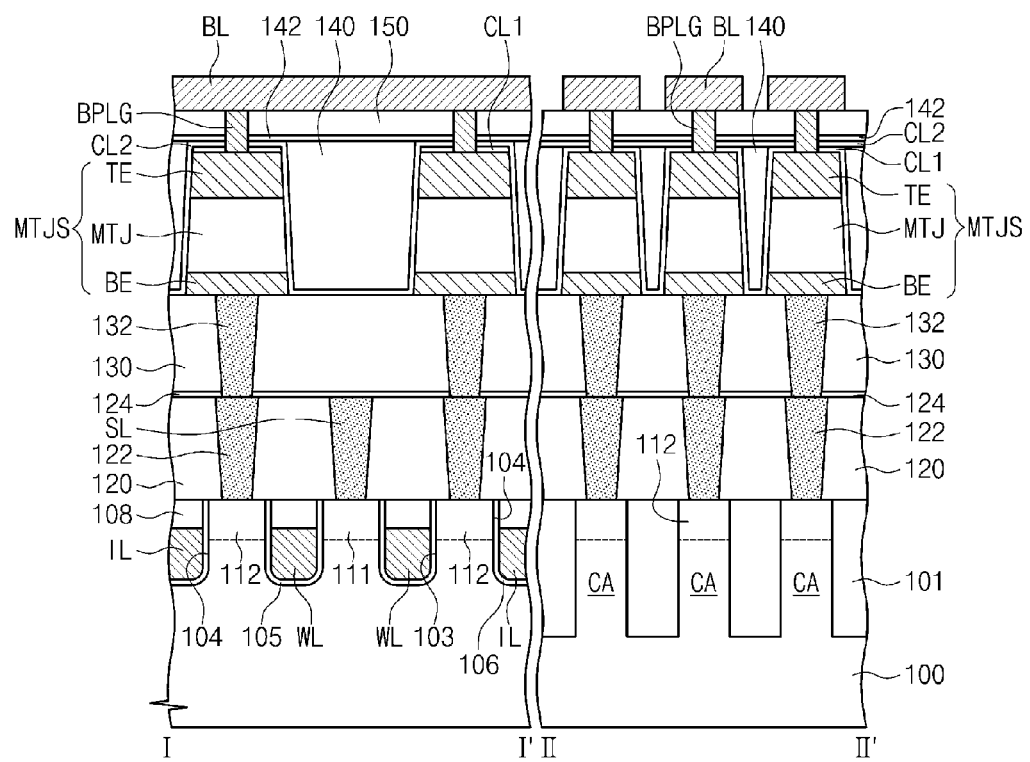
FIG. 15 depicts a cross-sectional view taken along lines I-I' and II-II' of FIG. 14.

FIG. 14 depicts a plan view illustrating a magnetic memory device according to exemplary embodiments of the present inventive concept. FIG. 15 depicts a cross-sectional view taken along lines I-I' and II-II' of FIG. 14.

Referring to FIGS. 14 and 15, a substrate 100 may be provided. The substrate 100 may be a silicon substrate, a germanium substrate, and/or a silicon-germanium substrate. The substrate 100 may have a first conductivity. A plurality of device isolation patterns 101 may be formed in the substrate 100. The device isolation patterns 101 may define a plurality of active line patterns ALP. From the plan view depicted in FIG. 14, the active line patterns ALP may extend parallel to each other in a first direction D1 and may have a line shape. The device isolation patterns 101 and the active line patterns ALP may be arranged alternately in a second direction D2 that is perpendicular or substantially perpendicular to the first direction D1. The active line patterns ALP may be doped with a first conductivity type dopant.

A plurality of isolation recess regions 104 may run across the active line patterns ALP and the device isolation patterns 101. The isolation recess regions 104 may have a shape of grooves that extend parallel or substantially parallel to each other in the second direction D2 if viewed in a plan view. The isolation recess regions 104 may divide the active line patterns ALP into a plurality of active patterns CA. Each of the active patterns CA may be a portion of the active line pattern ALP positioned between a pair of the isolation recess regions 104 that are adjacent to each other. In other words, each of the active patterns CA may be defined by a pair of adjacent device isolation patterns 101 and by a pair of adjacent isolation recess regions 104. As viewed in a plan view, the active patterns CA may be arranged in a matrix shape along the first and second directions D1 and D2.

At least one of gate recess regions 103 may run across the active patterns CA arranged along the second direction D2. The gate recess region 103 may have a groove shape that extends parallel or substantially parallel to the isolation recess regions 104. In an embodiment, a pair of the gate recess regions 103 may run across each of the active patterns CA. In this case, a pair of cell transistors may be formed on each of the active patterns CA.

The gate recess region 103 may have a depth that is substantially the same as the depth of the isolation recess region 104. The gate recess region 103 may have a width that is substantially the same as or different from the width of the isolation recess region 104. The depth of each of the gate and isolation recess regions 103 and 104 may be less than the depth of the device isolation pattern 101.

A word line WL may be disposed within each of the gate recess regions 103. A cell gate dielectric layer 105 may be disposed between the word line WL and an inner surface of each of the gate recess regions 103. Due to the shape of the gate recess region 103, the word line WL may have a line shape that extends in the second direction D2. The cell transistors may include the word line WL and a recessed channel region that conforms to the gate recess region 103.

An isolation line IL may be disposed within each of the isolation recess regions 104. An isolation gate dielectric layer 106 may be disposed between the isolation line IL and an inner surface of each of the isolation recess regions 104. The isolation line IL may have a line shape that extends in the second direction D2.

A gate mask pattern 108 may be disposed on each of the word line WL and the isolation gate line IL. Each top surface of the word line WL and the isolation line IL may be lower than each top of the gate and isolation recess regions 103 and 104. The gate mask pattern 108 may be disposed within each of the gate and isolation recess regions 103 and 104. The gate mask pattern 108 may have a top surface that is substantially coplanar with a top surface of the substrate 100.

When a magnetic memory device is operated, an isolation voltage may be applied to the isolation line IL. The isolation voltage may prevent channels from being created under the isolation recess regions 104. In other words, an isolation channel region under the isolation line IL may be turned off by the isolation voltage. The active patterns CA separated from each of the active line patterns ALP may be electrically insulated from each other. For example, in case that the active line patterns ALP are doped with a p-type dopant, the isolation voltage may be a ground voltage or a negative voltage.

The word line WL may include, for example, a semiconductor material doped with dopant (e.g., doped silicon, etc.), a metal (e.g., tungsten, aluminum, titanium, and/or tantalum), a conductive metal nitride (e.g., titanium nitride, tantalum nitride, and/or tungsten nitride), and/or a metal semiconductor compound (e.g., metal silicide). In an embodiment, the isolation line IL may be formed from a material identical to that forming the word line WL. The cell gate dielectric layer 105 and the isolation gate dielectric layer 106 may include, for example, a silicon oxide, a silicon nitride, and/or a high-k dielectric material (e.g., insulative metal oxide, such as hafnium oxide, aluminum oxide, etc.). The gate mask pattern 108 may include a silicon oxide, a silicon nitride, and/or a silicon oxynitride.

A first doped region 111 may be disposed in the active pattern CA between the word lines WL that are adjacent to each other. A second doped region 112 may be disposed in the active pattern CA between the word line WL and the isolation line IL. In an embodiment, the first doped region 111 may be positioned in a center of the active pattern CA, and a pair of the second doped regions 112 may be positioned in edges of the active pattern CA. The first doped region 111 may then be shared by the pair of cell transistors formed on each of the active patterns CA. The first and second doped regions 111 and 112 may correspond to source/drain regions of the cell transistor. The first and second doped regions 111 and 112 may be doped with a second conductivity type dopant that is different from the first conductivity type dopant. One of the first and second conductivity type dopants may be an n-type dopant, and the other of the first and second conductivity type dopants may be a p-type dopant.

A first interlayer dielectric layer 120 may be disposed on the substrate 100. The first interlayer dielectric layer 120 may be formed from, for example, a silicon oxide. A plurality of source lines SL may be provided to fill source grooves that may be formed in the first interlayer dielectric layer 120. The source lines SL may extend in parallel or substantially parallel to each other in the second direction D2. Each of the source lines SL may include a semiconductor material doped with dopant (e.g., doped silicon, etc.), a metal (e.g., tungsten, aluminum, titanium, and/or tantalum), a conductive metal nitride (e.g., titanium nitride, tantalum nitride, and/or tungsten nitride), and/or a metal semiconductor compound (e.g., metal silicide). Each of the source lines SL may be commonly electrically connected to the first doped regions 111 that are arranged along the second direction D2. A plurality of first contact plugs 122 may be disposed within first contact holes formed in the first interlayer dielectric layer 120 and respectively connected to the second doped regions 112. The first contact plugs 122 may be formed from a material that is identical to the material forming the source lines SL. Top surfaces of the source lines SL and the first contact plugs 122 may be substantially coplanar with a top surface of the first interlayer dielectric layer 120.

A first etch-stop layer 124 may be disposed on the first interlayer dielectric layer 120. The first etch-stop layer 124 may cover the top surfaces of the source lines SL. The first etch-stop layer 124 may be formed from an insulative material having an etch selectivity with respect to the first interlayer dielectric layer 120. For example, the first interlayer dielectric layer 120 may be formed from a silicon oxide, and the first etch-stop layer 124 may be formed from a silicon nitride and/or a silicon oxynitride.

A second interlayer dielectric layer 130 may be disposed on the first etch-stop layer 124. The second interlayer dielectric layer 130 may be formed from, for example, a silicon oxide.

A plurality of second contact plugs 132 may be provided to successively penetrate the second interlayer dielectric layer 130 and the first etch-stop layer 124. The second contact plugs 132 may be respectively electrically connected to the second doped regions 112 through the first contact plugs 122. In an embodiment, ohmic patterns (not shown) may be disposed between the second contact plugs 132, and the first contact plugs 122, between the first contact plugs 122 and the second doped regions 112, and between the source lines SL and the first doped regions 111. The ohmic pattern may include a metal semiconductor compound (e.g., metal silicide, such as cobalt silicide and/or titanium silicide).

A plurality of memory devices, i.e., a plurality of magnetic tunnel junction structures MTJS, may be disposed on the second interlayer dielectric layer 130. Each of the magnetic tunnel junction structures MTJS may include a bottom electrode BE, a magnetic tunnel junction MTJ, and a top electrode TE. The bottom electrode BE, the magnetic tunnel junction MTJ, and the top electrode TE may respectively have materials and configurations identical to the materials and configurations of the bottom electrode pattern 32, the magnetic tunnel junction MTJ, and the top electrode pattern 72 described in connection with FIGS. 11A and 11B. For example, the magnetic tunnel junction MTJ may include the first magnetic pattern 42, the tunnel barrier pattern 52, and the second magnetic pattern 62. The component parts of the magnetic tunnel junction MTJ have been described above and a detailed description at this point will be omitted.

In an embodiment, each of the magnetic tunnel junctions MTJS may be patterned to have an island shape. The island-shaped magnetic tunnel junction structures MTJS may be disposed to vertically overlap the second contact plugs 132.

The magnetic tunnel junction structures MTJS may have first sidewalls facing each other in the second direction D2, and a first capping insulation layer CL1 may be disposed on the first sidewalls. And, the magnetic tunnel junction structures MTJS may have second sidewalls facing each other in the first direction D1, and a second capping insulation layer CL2 may be disposed on the second sidewalls. That is, a first sidewall of a magnetic tunnel junction structure MTJS faces the second sidewall of an adjacent magnetic tunnel junction structure MTJS, and a second capping insulation layer CL2 may be disposed on the second sidewalls of the magnetic tunnel junction structures MTJS. The first and second capping insulation layers CL1 and CL2 may be sequentially stacked on top surfaces of the magnetic tunnel junction structures MTJS. The first and second capping insulation layers CL1 and CL2 may include, for example, a silicon nitride.

A third interlayer dielectric layer 140 may be disposed on the second interlayer dielectric layer 130 to wrap the sidewalls of the magnetic tunnel junction structures MTJS. And, a second etch-stop layer 142 may be disposed on the third interlayer dielectric layer 140. The second etch-stop layer 142 may cover a top surface of the second capping insulation layer CL2.

A fourth interlayer dielectric layer 150 may be disposed on the second etch-stop layer 142. And, a bit line BL may be disposed on the fourth interlayer dielectric layer 150. The bit line BL may extend in the first direction D1. The bit line BL may be commonly connected to the plurality of the magnetic tunnel junction structures MTJS that are arranged in the first direction D1. In an embodiment, the bit line BL and the magnetic tunnel junction structures MTJS may be connected to each other through a plurality of bit line contact plugs BPLG that are disposed between the bit line BL and the magnetic tunnel junction structures. However, the subject matter disclosed herein is not limited to the features described above. In other embodiments, the bit line contact plugs BPLG may be omitted, and the bit line BL may be in direct contact with the magnetic tunnel junction structures MTJS.

FIGS. 16 to 19 depict cross-sectional views, taken along lines I-I' and II-II' of FIG. 14, illustrating a method for manufacturing a magnetic memory device according to exemplary embodiments of the present inventive concept.

Figure 16:
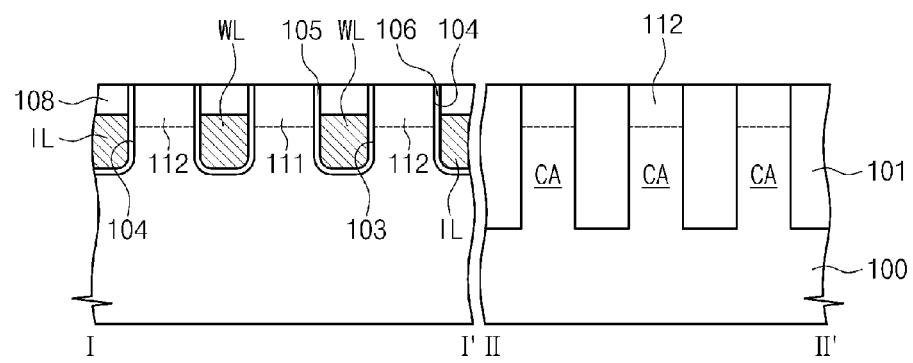
FIGS. 16 to 19 depict cross-sectional views, taken along lines I-I' and II-II' of FIG. 14, illustrating a method for manufacturing a magnetic memory device according to exemplary embodiments of the present inventive concept.

Referring to FIGS. 14 and 16, a plurality of device isolation patterns 101 may be formed in a substrate 100 to define a plurality of active line patterns ALP. The active line patterns ALP may extend parallel or substantially parallel to each other in a first direction D1. The device isolation patterns 101 may be formed by a shallow trench isolation (STI) process. The substrate 100 may be a semiconductor substrate doped with a first conductivity type dopant.

The active line patterns ALP and the device isolation patterns 101 may be patterned to form a plurality of gate recess regions 103 and a plurality of isolation recess regions 104 that extend parallel or substantially parallel to each other in a second direction D2. The isolation recess regions 104 may divide each of the active line patterns ALP into a plurality of active patterns CA. The gate recess regions 103 may run across the active patterns CA. Each of the gate and isolation recess regions 103 and 104 may have a depth that is less than a depth of each of the device isolation patterns 101.

A cell gate dielectric layer 105 may be formed to have a thickness that is substantially uniform on an inner surface of each of the gate recess regions 103. An isolation gate dielectric layer 106 may be formed to have a thickness that is substantially uniform on an inner surface of each of the isolation recess regions 104. In an embodiment, the cell and isolation gate dielectric layers 105 and 106 may be formed at the same time. The cell and isolation gate dielectric layers 105 and 106 may be a silicon oxide layer that is formed by a thermal oxidation. Alternatively, the cell and gate dielectric layers 105 and 106 may include a silicon oxide, a silicon nitride, a silicon oxynitride, and/or a high-k dielectric material (e.g., insulative metal oxide, such as hafnium oxide and/or aluminum oxide).

Subsequently, a first conductive layer may be formed to fill the gate and isolation recess regions 103 and 104. The first conductive layer may include a semiconductor material doped with dopant (e.g., doped silicon, etc.), a metal (e.g., tungsten, aluminum, titanium, and/or tantalum), a conductive metal nitride (e.g., titanium nitride, tantalum nitride, and/or tungsten nitride), and/or a metal semiconductor compound (e.g., metal silicide). The first conductive layer may be etched to form a word line WL within each of the gate recess regions 103 and an isolation layer IL within each of the isolation recess regions 104. Top surfaces of the word line WL and the isolation line IL may be recessed to be lower than that of the substrate 100.

A gate mask pattern 108 may be formed on each of the word line WL and the isolation line IL to fill each of the gate and isolation recess regions 103 and 104. The gate mask pattern 108 may include a silicon oxide, a silicon nitride, and/or a silicon oxynitride.

The active patterns CA on opposing sides of the word line WL may be doped with a second conductivity type dopant that is different from the first conductivity type dopant, so that a first doped region 111 and a second doped region 112 may be formed in the substrate 100. The first and second doped regions 111 and 112 may have a bottom surface that is higher than the bottom surfaces of the word line WL and the isolation line IL.

Figure 17:
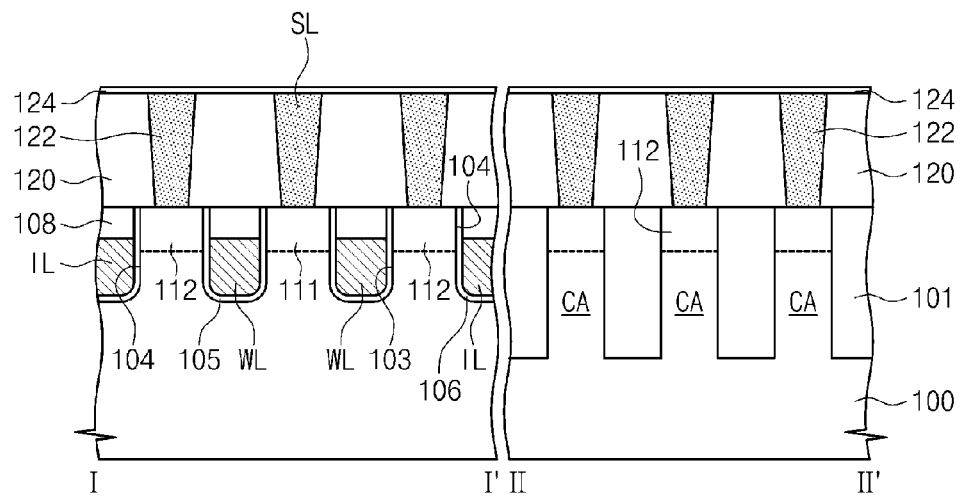

Referring to FIGS. 14 and 17, a first interlayer dielectric layer 120 may be formed on the substrate 100. The first interlayer dielectric layer 120 may be formed from a silicon oxide. The first interlayer dielectric layer 120 may be patterned to form cell holes and source grooves.

A second conductive layer may be formed to fill the cell holes and the source grooves. The second conductive layer may include a semiconductor material doped with dopant (e.g., doped silicon, etc.), a metal (e.g., tungsten, aluminum, titanium, and/or tantalum), a conductive metal nitride (e.g., titanium nitride, tantalum nitride, and/or tungsten nitride), and/or a metal semiconductor compound (e.g., metal silicide). The second conductive layer may be planarized until the first interlayer dielectric layer 120 is exposed so that a plurality of contact plugs 122 may be formed in the cell holes and a plurality of source lines SL may be formed in the source grooves. The first contact plugs 122 may be coupled to the second doped regions 112, and the source lines SL may be coupled to the first doped regions 111. In an embodiment, ohmic patterns (not shown) may be formed between the first contact plugs 122 and the second doped regions 112, and between the source lines SL and the first doped regions 111. The ohmic pattern may include a metal semiconductor compound (e.g., a metal silicide, such as cobalt silicide and/or titanium silicide).

Thereafter, a first etch-stop layer 124 may be formed on the first interlayer dielectric layer 120, the first contact plugs 122, and the source lines SL. The first etch-stop layer 124 may be formed from a silicon nitride and/or a silicon oxynitride.

Figure 18:
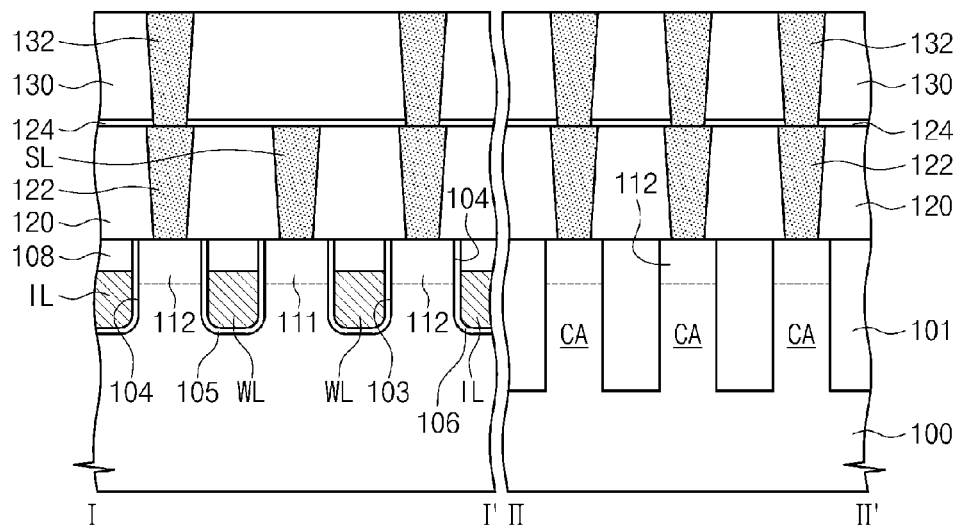

Referring to FIGS. 14 and 18, a second interlayer dielectric layer 130 may be formed on the first etch-stop layer 124. The second interlayer dielectric layer 130 may be formed from a silicon oxide. A plurality of second contact plugs 132 may be formed to successively penetrate the second interlayer dielectric layer 130 and the first etch-stop layer 124. The second contact plugs 132 may be formed by a process similar to that used to form the first contact plugs 122, and formed from a material identical to the material of the first contact plugs 122. The second contact plugs 132 may be respectively connected to the first contact plugs 122 and thus electrically connected to the second doped regions 112. In an embodiment, ohmic patterns (not shown) may be formed between the second contact plugs 132 and the first contact plugs 122. The ohmic pattern may include a metal semiconductor compound (e.g., metal silicide such as cobalt silicide or titanium silicide).

Figure 19:
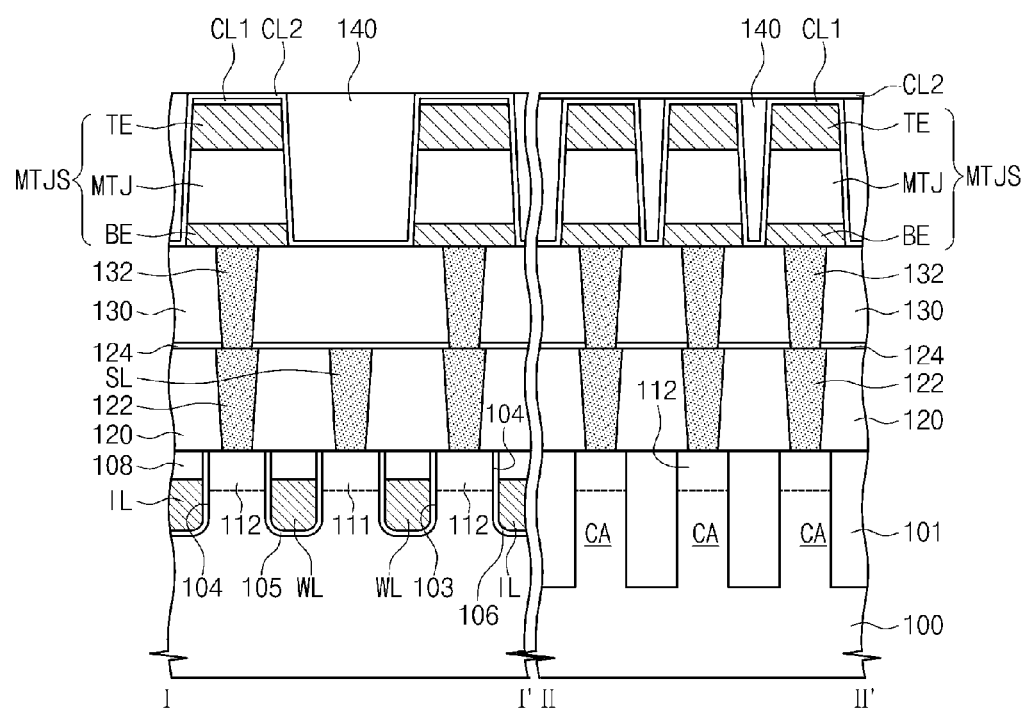

Referring to FIGS. 14 and 19, a plurality of memory devices, i.e., a plurality of magnetic tunnel junction structures MTJS, may be formed on the second interlayer dielectric layer 130. Each of the magnetic tunnel junction structures MTJS may include a bottom electrode BE, a magnetic tunnel junction MTJ, and a top electrode TE. Each of the magnetic tunnel junction structures MTJS may be formed by the method for fabricating the memory device ME according to an exemplary embodiment disclosed herein. For example, each of the magnetic tunnel junction structures MTJS may be patterned to have a shape of an island by performing an ion-beam etch process twice, one of which uses the first line mask patterns as an etch mask and the other on which uses the second mask patterns as an etch mask. The island-shaped magnetic tunnel junction structures MTJS may be disposed to vertically overlap the second contact plugs 132. In addition, during or after the formation of the magnetic tunnel junction structures MTJS, there may be formed a first capping insulation layer CL1, a second capping insulation layer CL2, and a third interlayer dielectric layer 140. For example, the third interlayer dielectric layer 140 may correspond to the filling insulation layer 94 and the first portion 84a of the upper interlayer dielectric layer 84 discussed with in connection with FIGS. 13A and 13B.

Referring back to FIGS. 14 and 15, a second etch-stop layer 142 may be formed on the third interlayer dielectric layer 140 and a fourth interlayer dielectric layer 150 may be formed on the second etch-stop layer 142. A bit line BL may be formed on the fourth interlayer dielectric layer 150. The bit line BL may extend in the first direction D1, and a plurality of bit line contact plugs BPLG may be formed to connect the bit line BL commonly to the plurality of the magnetic tunnel junction structures MTJS arranged in the first direction D1.

According to exemplary embodiments disclosed herein, the magnetic tunnel junction layer MTJL may be patterned by performing an ion-beam etch process twice in such a manner that the first line mask patterns MP1 extending in the first direction D1 and the second line mask patterns MP2 extending in the second direction D2 are respectively used as an etch mask for each etch process, thereby forming the magnetic tunnel junctions MTJ disposed in a shape of an island. During each of the ion-beam etch processes, the ion beams may be continuously incident onto the sidewalls of the magnetic tunnel junctions MTJ, and thus it may be possible to effectively remove an etch byproduct that may be redeposited on the sidewalls of the magnetic tunnel junctions MTJ. Accordingly, the magnetic tunnel junctions MTJ may be formed to have enhanced electrical characteristics, and a magnetic memory device formed from the magnetic tunnel junctions MTJ may be provided with improved reliability.

Figure 20:
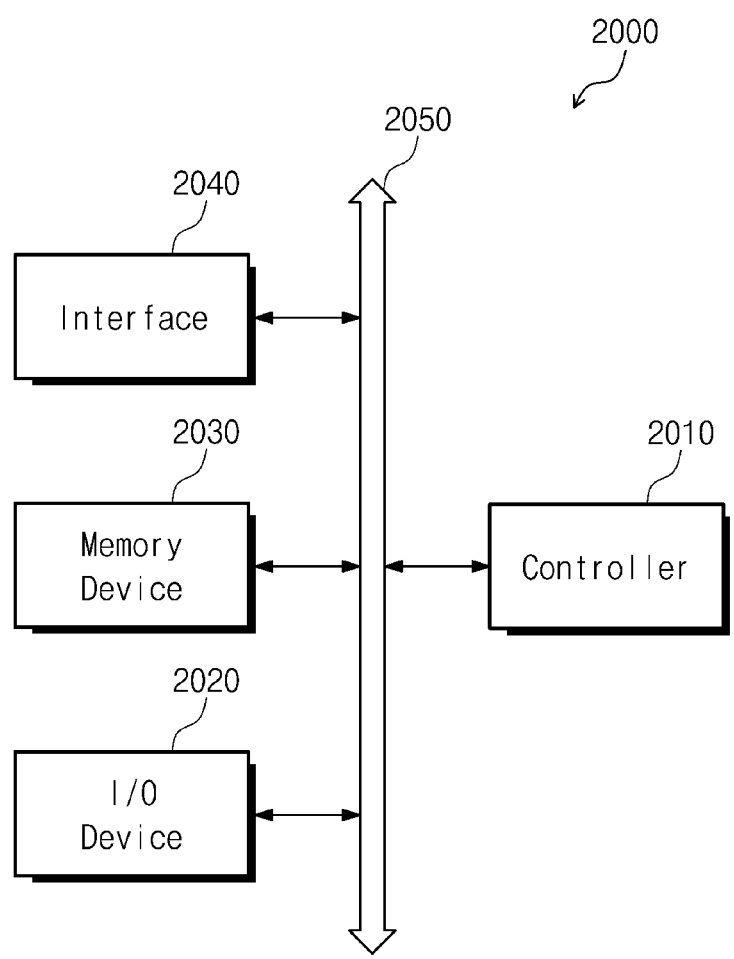
FIG. 20 depicts an electronic device that comprises one or more integrated circuits (chips) comprising a semiconductor device that includes a data storage device according to embodiments disclosed herein.

FIG. 20 depicts an electronic device 2000 that comprises one or more integrated circuits (chips) comprising a semiconductor device that includes a data storage device according to embodiments disclosed herein. Electronic device 2000 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 2000 may comprise a controller 2010, an input/output device 2020 such as, but not limited to, a keypad, a keyboard, a display, or a touch-screen display, a memory 2030, and a wireless interface 2040 that are coupled to each other through a bus 2050. The controller 2010 may comprise, for example, at least one microprocessor, at least one digital signal process, at least one microcontroller, or the like. The memory 2030 may be configured to store a command code to be used by the controller 2010 or a user data. Electronic device 2000 and the various system components comprising a semiconductor device that includes a data storage device according to embodiments disclosed herein. The electronic device 2000 may use a wireless interface 2040 configured to transmit data to or receive data from a wireless communication network using a RF signal. The wireless interface 2040 may include, for example, an antenna, a wireless transceiver and so on. The electronic system 2000 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Although the present invention has been described in connection with the embodiment of the present invention illustrated in the accompanying drawings, it is not limited thereto. It will be apparent to those skilled in the art that various substitution, modifications and changes may be thereto without departing from the scope of the accompanying claims.

What is claimed is:

1. A method of manufacturing a magnetic memory device, the method comprising:
    forming a magnetic tunnel junction layer including a first magnetic layer, a tunnel barrier layer, and a second magnetic layer that are sequentially stacked on a substrate;
    forming, on the magnetic tunnel junction layer, first line mask patterns that extend in a first direction and are spaced apart from each other in a second direction that crosses the first direction;
    etching the magnetic tunnel junction layer by a first ion-beam etch process using the first line mask patterns as an etch mask to form preliminary magnetic tunnel junctions that extend in the first direction;
    forming, on the preliminary magnetic tunnel junctions, second line mask patterns that extend in the second direction and are spaced apart from each other in the first direction;
    etching the preliminary magnetic tunnel junctions by a second ion-beam etch process using the second line mask patterns as an etch mask to form magnetic tunnel junctions,
    wherein the magnetic tunnel junctions are arranged in shapes of islands along the first direction and the second direction; and
    forming, after forming the preliminary magnetic tunnel junctions, an interlayer dielectric layer, wherein the interlayer dielectric layer comprises a first portion filling a gap between the preliminary magnetic tunnel junctions and a second portion positioned at a level above a top surface of the preliminary magnetic tunnel junctions, and wherein the second portion is etched to form the second line mask patterns.

2. The method of claim 1,
    wherein the first and second directions are substantially parallel to a top surface of the substrate,
    wherein the first ion-beam etch process uses first and second ion beams that are obliquely incident toward the substrate, the first and second ion beams being substantially reciprocally symmetric to a normal line that is perpendicular to the top surface of the substrate, and
    wherein the second ion-beam etch process uses third and fourth ion beams that are obliquely incident toward the substrate, the third and fourth ion beams being substantially reciprocally symmetric to the normal line,
    the first to fourth ion beams having different incident directions from each other.

3. The method of claim 2, wherein a vector component of each of the incident directions of the first and second ion beams is substantially parallel to a first plane defined by the second direction and a third direction which is substantially parallel to the normal line,
    wherein the incident direction of the first ion beam includes a vector component in the second direction and the incident direction of the second ion beam includes a vector component in a direction that is opposite to the second direction in a plan view of the magnetic memory device.

4. The method of claim 3, wherein a vector component of each of the incident directions of the third and fourth ion beams is substantially parallel to a second plane defined by the third direction and the first direction,
    wherein the incident direction of the third ion beam includes a vector component in the first direction and the incident direction of the fourth ion beam includes a vector component in a direction that is opposite to the first direction in a plan view of the magnetic memory device.

5. The method of claim 2,
    wherein each of the preliminary magnetic tunnel junctions comprises first and second sidewalls facing each other in the second direction,
    and comprising: forming, before forming the second line mask patterns, a first capping insulation layer on the first and second sidewalls.

6. The method of claim 5, wherein
    the first ion beam sequentially etches the first magnetic layer, the tunnel barrier layer, and the second magnetic layer to form the first sidewall, and the second ion beam sequentially etches the first magnetic layer, the tunnel barrier layer, and the second magnetic layer to form the second sidewall.

7. The method of claim 5,
wherein each of the magnetic tunnel junctions comprises third and fourth sidewalls faces each other in the first direction,
and comprising forming a second capping insulation layer on the third and fourth sidewalls.

8. The method of claim 7,
wherein each of the magnetic tunnel junctions comprises a preliminary first magnetic pattern, a preliminary tunnel barrier pattern, and a preliminary second magnetic pattern that are respectively formed from the first magnetic layer, the tunnel barrier layer, and the second magnetic layer,
wherein the third ion beam sequentially etches the preliminary first magnetic pattern, the preliminary tunnel barrier pattern, and the preliminary second magnetic pattern to form the third sidewall, and
wherein the fourth ion beam sequentially etches the preliminary first magnetic pattern, the preliminary tunnel barrier pattern, and the preliminary second magnetic pattern to form the fourth sidewall.

9. The method of claim 1, further comprising:
forming, before forming the first line mask patterns, a top electrode layer on the magnetic tunnel junction layer; and
etching the top electrode layer by a first etch process using the first line mask patterns as an etch mask to form preliminary top electrode patterns,
wherein each of the preliminary top electrode patterns extends in the first direction.

10. The method of claim 9,
wherein the second line mask patterns are formed on the preliminary top electrode patterns,
and further comprising: etching, before performing the second ion-beam etch process, the preliminary top electrode patterns by a second etch process using the second line mask patterns as an etch mask to form top electrode patterns,
the top electrode patterns being arranged in a shape of an island along the first direction and the second direction.

11. The method of claim 10,
wherein each of the first and second etch processes comprises a plasma-etch process or a reactive-ion etch process.

12. A method of manufacturing a magnetic memory device, the method comprising:
forming a magnetic tunnel junction layer including a first magnetic layer, a tunnel barrier layer, and a second magnetic layer that are sequentially stacked on a substrate; and
patterning the magnetic tunnel junction layer to form magnetic tunnel junctions that are arranged in a shape of an island along a first direction and a second direction that crosses the first direction,
the patterning the magnetic tunnel junction layer comprising:
performing a first ion-beam etch process that uses first line mask patterns as an etch mask on the magnetic tunnel junction layer to form preliminary magnetic tunnel junctions, wherein the first line mask patterns extend in the first direction and are arranged along the second direction;
performing a second ion-beam etch process that uses second line mask patterns as an etch mask on the preliminary magnetic tunnel junctions to form magnetic tunnel junctions, wherein the second line mask patterns extend in the second direction and are arranged along the first direction;
forming, before the performing of the second ion-beam etch process, a first capping insulation layer on a top surface of each of the preliminary magnetic tunnel junctions; and
forming a second capping insulation layer on a top surface of each of the magnetic tunnel junctions so that the first capping insulation layer is interposed between the second capping insulation layer and the top surface of each of the magnetic tunnel junctions,
wherein the first ion-beam etch process uses first and second ion beams that are obliquely incident toward the substrate, the first and second ion beams being substantially reciprocally symmetric to a normal line that is perpendicular to a top surface of the substrate, and
wherein the second ion-beam etch process uses third and fourth ion beams that are obliquely incident toward the substrate, the third and fourth ion beams being substantially reciprocally symmetric to the normal line,
the first to fourth ion beams having different incident directions from each other.

13. The method of claim 12, wherein the first and second directions are substantially parallel to the top surface of the substrate,
wherein the incident directions of each of the first and second ion beams are substantially parallel to a first plane defined by the second direction and a third direction that is substantially perpendicular to the normal line,
the incident direction of the first ion beam including a vector component in the second direction and the incident direction of the second ion beam including a vector component in a direction that is opposite to the second direction in a plan view of the magnetic memory device, and
wherein the incident directions of each of the third and fourth ion beams are substantially parallel to a second plane defined by the third direction and the first direction,
the incident direction of the third ion beam including a vector component in the first direction and the incident direction of the fourth ion beam including a vector component in a direction that is opposite to the first direction in a plan view of the magnetic memory device.

14. The method of claim 12, wherein the first ion-beam etch process etches the magnetic tunnel junction layer to form preliminary magnetic tunnel junctions that extend along the first direction and are spaced apart from each other in the second direction, and
wherein the second line mask patterns are formed on the preliminary magnetic tunnel junctions to run across the preliminary magnetic tunnel junctions.

15. A method of manufacturing a magnetic memory device, the method comprising:
forming a magnetic tunnel junction layer, the magnetic tunnel junction layer comprising a first magnetic layer, a second magnetic layer and a tunnel barrier layer between the first magnetic layer and the second magnetic layer;
forming first line mask patterns on the magnetic tunnel junction layer, the first line mask patterns extending in a first direction and being spaced apart from each other in a second direction that is substantially perpendicular to the first direction, and the first and second directions being substantially parallel to a top surface of the magnetic tunnel junction layer;

etching the magnetic tunnel junction layer using a first ion-beam etch to form a plurality of preliminary magnetic tunnel junctions that extend in the first direction, the first ion-beam etch including a vector component that is projected onto a plane formed by the first and second directions, the projected vector component of the first ion-beam etch being in a direction that is substantially parallel to the second direction;

forming second line mask patterns on the preliminary magnetic tunnel junctions, the second line mask patterns extending in the second direction and being spaced apart from each other in the first direction;

etching the preliminary magnetic tunnel junctions using a second ion-beam etch to form magnetic tunnel junction patterns each having an island shape, the second ion-beam etch including a vector component that is projected onto the plane formed by the first and second directions, the projected vector component of the second ion-beam etch being in a direction that is substantially parallel to the first direction;

forming, before forming the second line mask patterns, a first capping insulation layer on a top surface of each of the preliminary magnetic tunnel junctions; and forming a second capping insulation layer on a top surface of each of the magnetic tunnel junction patterns so that the first capping insulation layer is interposed between the second capping insulation layer and the top surface of each of the magnetic tunnel junction patterns.

16. The method of claim 15, wherein the first ion-beam etch includes first and second ion beams that are obliquely incident toward the plane formed by the first and second directions, the first and second ion beams being substantially reciprocally symmetric to a normal line that is perpendicular to the plane formed by the first direction and the second direction, wherein the second ion-beam etch includes third and fourth ion beams that are obliquely incident toward the plane formed by the first and second directions, the third and fourth ion beams being substantially reciprocally symmetric to the normal line, and wherein the first to fourth ion beams each have different incident directions from each other.

17. The method of claim 16, wherein the projected vector component of each of the incident directions of the first and second ion beams are substantially parallel to a plane defined by the second direction and a third direction, the third direction being substantially parallel to the normal line, and wherein the incident direction of a vector component of the first ion beam that is projected onto the plane formed by the first and second directions is substantially parallel to the second direction and the incident direction of a vector component of the second ion beam that is projected onto the plane formed by the first and second direction is substantially parallel to a direction that is opposite to the second direction.

18. The method of claim 17, wherein a vector component of each of the incident directions of the third and fourth ion beams are substantially parallel to a plane formed by the third direction and the first direction, and wherein the incident direction of a vector component of the third ion beam that is projected onto the plane formed by the first and second directions is substantially parallel to the first direction and the incident direction of a vector component of the fourth ion beam that is projected onto the plane formed by the first and second directions is substantially parallel to a direction that is opposite to the first direction.

19. The method of claim 16, wherein each of the preliminary magnetic tunnel junctions comprises first and second sidewalls, a first sidewall facing a second side wall of an adjacent preliminary magnetic tunnel junction in the second direction, the method further comprising forming a first capping insulation layer on the first and second sidewalls before forming the second line mask patterns.

* * * * *